United States Patent
Kim et al.

(10) Patent No.: US 12,484,366 B2
(45) Date of Patent: Nov. 25, 2025

(54) SOLAR CELL, METHOD FOR MANUFACTURING THE SAME, AND SOLAR CELL MODULE COMPRISING THE SAME

(71) Applicant: Shangrao Xinyuan YueDong Technology Development Co. Ltd, Jiangxi (CN)

(72) Inventors: Chungyi Kim, Seoul (KR); Ilhyoung Jung, Seoul (KR); Jeongbeom Nam, Seoul (KR)

(73) Assignee: Shangrao Xinyuan YueDong Technology Development Co. Ltd, Shangrao (CN)

( * ) Notice: Subject to any disclaimer, the term of this patent is extended or adjusted under 35 U.S.C. 154(b) by 43 days.

(21) Appl. No.: 18/515,227

(22) Filed: Nov. 20, 2023

(65) Prior Publication Data

US 2024/0090246 A1   Mar. 14, 2024

Related U.S. Application Data

(63) Continuation of application No. PCT/KR2021/014549, filed on Oct. 19, 2021.

(30) Foreign Application Priority Data

Sep. 10, 2021  (KR) .................. 10-2021-0121142

(51) Int. Cl.
  *H10K 30/40*  (2023.01)
  *H10K 39/18*  (2023.01)
(52) U.S. Cl.
  CPC ............. *H10K 30/40* (2023.02); *H10K 39/18* (2023.02)
(58) Field of Classification Search
  CPC .................. H10K 30/40; H10K 39/18
  See application file for complete search history.

(56) References Cited

U.S. PATENT DOCUMENTS 10,644,179 B1 *   5/2020  Bush ............... H10K 30/82
2009/0242013 A1 * 10/2009  Taguchi ............ H10F 19/80
                                                    136/246

(Continued)

FOREIGN PATENT DOCUMENTS

CN    110235257 A    9/2019
CN    111615752 A    9/2020

(Continued)

OTHER PUBLICATIONS

Lv (Year: 2020).*

(Continued)

*Primary Examiner* — Sadie White
(74) *Attorney, Agent, or Firm* — Wiersch Law Group

(57) ABSTRACT

A solar cell includes a first photoelectric conversion part, a second photoelectric conversion part, a side insulating layer, a first electrode, and a second electrode. The first photoelectric conversion part includes a photoelectric conversion layer composed of a perovskite compound, a first transport layer on one side of the photoelectric conversion layer, and a second transport layer on the other side of the photoelectric conversion layer. The second photoelectric conversion part is arranged below the second transport layer and has a different material or structure from the first photoelectric conversion part. The side insulating layer is formed as a side surface surrounding the first photoelectric conversion part. The first electrode is electrically connected to the first photoelectric conversion part on one surface of the first photoelectric conversion part serving as a light-receiving surface. The second electrode is electrically connected to a bottom of the second photoelectric conversion part.

15 Claims, 15 Drawing Sheets

(56) References Cited

U.S. PATENT DOCUMENTS

| | | | |
|---|---|---|---|
| 2017/0229518 A1* | 8/2017 | Uddin | H10K 30/152 |
| 2018/0019358 A1* | 1/2018 | Ahn | H10F 77/311 |
| 2018/0019360 A1 | 1/2018 | Mishima et al. | |
| 2019/0006457 A1* | 1/2019 | Aleksov | H01L 23/49822 |
| 2019/0035964 A1* | 1/2019 | Lincot | H10F 10/164 |
| 2019/0081189 A1* | 3/2019 | Mishima | H10F 77/122 |
| 2019/0279825 A1* | 9/2019 | van Hest | H10K 30/40 |
| 2021/0082634 A1 | 3/2021 | Lee et al. | |
| 2022/0102659 A1* | 3/2022 | Kamino | H10K 30/80 |
| 2022/0278290 A1* | 9/2022 | Sebastien | H10K 30/10 |

FOREIGN PATENT DOCUMENTS

| | | |
|---|---|---|
| JP | 2017034056 A | 2/2017 |
| JP | 2020506560 A | 2/2020 |
| KR | 20110032407 A | 3/2011 |
| KR | 20180011832 A | 2/2018 |
| KR | 20180063866 A | 6/2018 |
| KR | 20190115382 A | 10/2019 |
| WO | 2016157979 A1 | 10/2016 |
| WO | 2019146366 A1 | 8/2019 |
| WO | WO-2020109129 A1 * | 6/2020 ......... H01L 31/0504 |
| WO | 2020246074 A1 | 12/2020 |
| WO | WO-2021005191 A1 * | 1/2021 ........... H01L 27/302 |

OTHER PUBLICATIONS

Sahli (Year: 2018).*
Japanese Office Action for Application No. 2023-568727, mailed Oct. 22, 2024 (6 pages).
International Search Report (PCT/KR2021/014549 ); Date of Mailing: May 30, 2022.
Research-trends-of-perovskite-based-tandem-Solar Cell.
Japanese Office Action for Application No. 2023-568727, mailed Mar. 11, 2025 (7 pages).
European Search Report issued in corresponding EP Application 21956894.6, issued Jul. 8, 2025 (12 pages).
Fully textured monolithic perovskite/silicon tandem solar cells with 25.2% power conversion efficiency, Nature materials, (2018)17(9), 820-826.
All Set for Efficient and Reliable Perovskite/Silicon Tandem Photovoltaic Modules, Solar RRL, 2022, 6(3): 2100493.
Composite Encapsulation Enabled Superior Comprehensive Stability of Perovskite Solar Cells, ACS Applied Materials & Interfaces, 2020, 12(24): 27277-27285.

* cited by examiner

SOLAR CELL, METHOD FOR MANUFACTURING THE SAME, AND SOLAR CELL MODULE COMPRISING THE SAME

CROSS-REFERENCE TO RELATED APPLICATIONS

This is a continuation of International Application No. PCT/KR2021/014549, filed on Oct. 19, 2021, which claims priority to Korean Patent Application No. 10-2021-0121142 filed in the Republic of Korea on Sep. 10, 2021, both of which are hereby expressly incorporated by reference into the present application.

TECHNICAL FIELD

The present disclosure relates to a solar cell, a method for manufacturing a solar cell, and a solar cell module, and in particular, to a solar cell module including a perovskite structure.

BACKGROUND

A solar cell including a semiconductor substrate has excellent efficiency and has been widely used. However, the solar cell including the semiconductor substrate also have certain limitations in improving efficiency, and as a result, solar cells having various structures capable of improving photoelectric conversion efficiency have been proposed.

For example, a solar cell in which a photovoltaic part containing a perovskite compound that absorbs light of a short wavelength and performs photoelectric conversion using a short wavelength has been proposed. However, when a photoelectric conversion layer is formed from this perovskite compound, a perovskite compound layer is formed by chemical reaction of an organic material and an inorganic material.

In order to form the perovskite compound layer as described above, in Korean Laid-Open Patent Publication No. 10-2018-0099577 (published on Sep. 5, 2018), a method of preparing a perovskite solution by mixing organic material and inorganic material, and then coating a substrate with the perovskite solution to form the perovskite compound layer is disclosed.

Then, a technology of manufacturing a tandem cell by forming a first photoelectric conversion region using the semiconductor substrate and then forming a perovskite compound layer thereon by deposition is developed.

In the tandem cell as described above, although a second photoelectric conversion region is continuously formed by deposition on the first photoelectric conversion region, the deposition is performed in a state where the first photoelectric conversion region is fixed with a fixing portion of a deposition device. Therefore, an inactive region is formed in an edge region according to the deposition device.

A problem of power reduction occurs due to the reduction of the active region of the cell. In order to reduce the inactive region as described above, various attempts have been made.

In addition, when the edge region as described above is used as a space for forming a pad, an upper electrode forming the pad extends along a side surface and has a step, there is a risk that electrons separated from a perovskite layer are recombined with holes in the pad to cause short circuiting of a current.

In addition, for modularization of a plurality of solar cells to form a solar cell module, modularization of a tandem cell including the perovskite layer is emerging.

A device and a technology for simultaneously soldering a plurality of wirings to a plurality of solar cells are disclosed in U.S. Pat. No. 8,013,236, there are concerns as to whether such technology is applicable to technical extension of the tandem cell including the perovskite layer.

PRIOR ART REFERENCES

Patent References

Korean Laid-Open Patent Publication No. 10-2018-0099577 (published on Sep. 5, 2018)
U.S. Pat. No. 8,013,236 (published on Sep. 6, 2011)

SUMMARY

A solar cell according to some embodiments of the present disclosure includes a first photoelectric conversion part, a second photoelectric conversion part, a side insulating layer, a first electrode, and a second electrode. The first photoelectric conversion part includes a photoelectric conversion layer composed of a perovskite compound, a first transport layer on one side of the photoelectric conversion layer, and a second transport layer on the other side of the photoelectric conversion layer. The second photoelectric conversion part is arranged below the second transport layer of the first photoelectric conversion part and has a different material or structure from the first photoelectric conversion part. The side insulating layer is formed as a side surface surrounding the first photoelectric conversion part. The first electrode is electrically connected to the first photoelectric conversion part on one surface of the first photoelectric conversion part serving as a light-receiving surface, and the second electrode is electrically connected to a bottom of the second photoelectric conversion part.

In addition, some embodiments of the present disclosure provide a solar cell module. The solar cell module includes a plurality of solar cells and connecting members connected between adjacent solar cells. Each of the solar cells includes a first photoelectric conversion part, a second photoelectric conversion part, a side insulating layer, a first electrode, and a second electrode. The first photoelectric conversion part includes a photoelectric conversion layer composed of a perovskite compound, a first transport layer on one side of the photoelectric conversion layer, and a second transport layer on the other side of the photoelectric conversion layer. The second photoelectric conversion part is arranged below the second transport layer of the first photoelectric conversion part and has a different material or structure from the first photoelectric conversion part. The side insulating layer is formed as a side surface surrounding the first photoelectric conversion part. The first electrode is electrically connected to the first photoelectric conversion part on one surface of the first photoelectric conversion part serving as a light-receiving surface, and the second electrode is electrically connected to a bottom of the second photoelectric conversion part. The first electrode includes a plurality of busbar electrodes spaced apart from each other and extending in a direction.

In addition, some embodiments of the present disclosure provide a method for manufacturing a solar cell. The solar cell manufacturing method includes: a step of forming a second photoelectric conversion part including a conductive region on a semiconductor substrate; a step of forming, on the second photoelectric conversion part, a first photoelectric conversion part including a photoelectric conversion layer composed of a perovskite compound, a first transport layer on one side of the photoelectric conversion layer, and a second transport layer on the other side of the photoelectric conversion layer; a step of forming a side insulating layer surrounding a side surface of the first photoelectric conversion part; and a step of forming a first electrode, on one surface of the first photoelectric conversion part serving as a light-receiving surface, electrically connected to the first photoelectric conversion part and having a cutting region to expose a center and a second electrode electrically connected to a bottom of the second photoelectric conversion part and having the cutting region.

Figure 1:
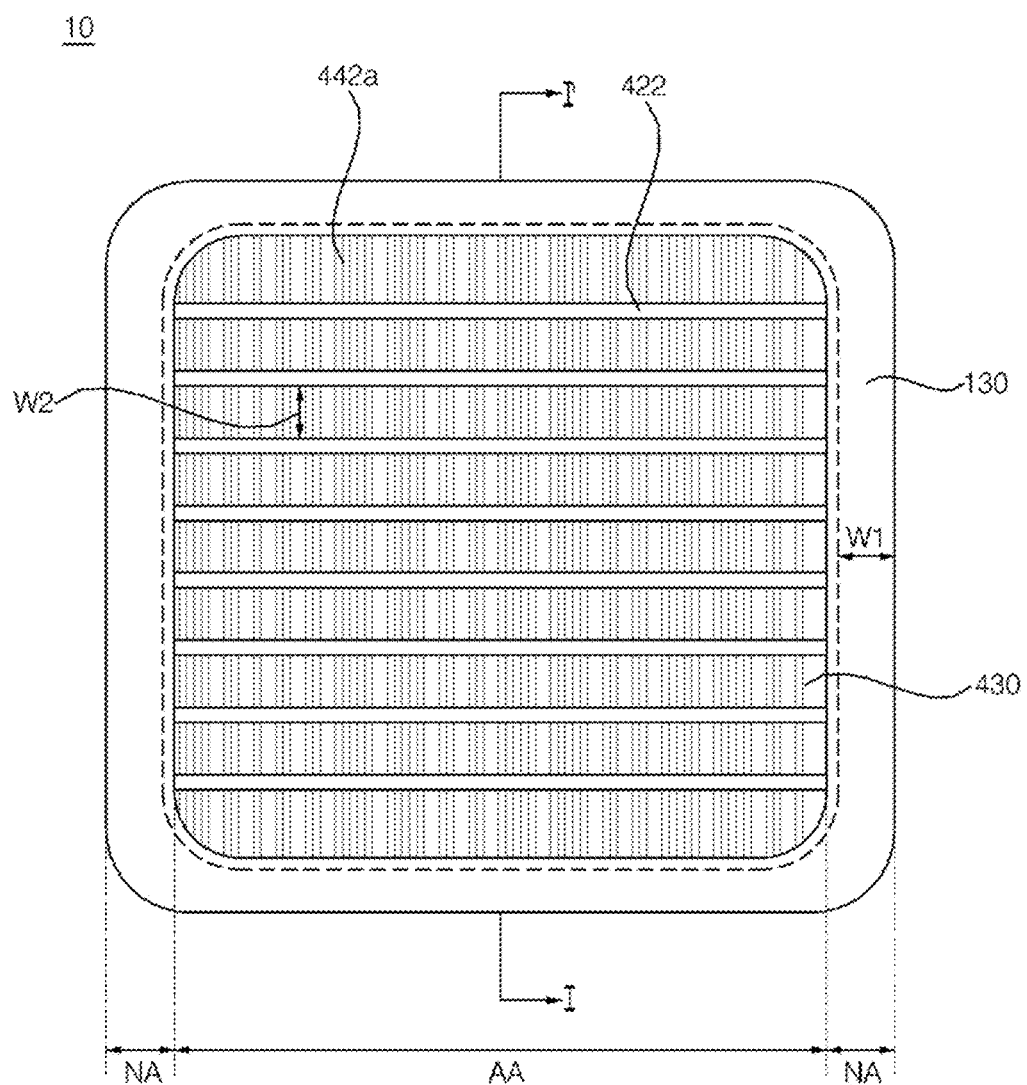
FIG. 1 is a plan view of a solar cell according to some embodiments of the present disclosure.

REFERENCE SIGNS 100, 100': solar cell module
10, 10': solar cell
20: lead
300: lead film
110: first photoelectric conversion part
120, 130: second photoelectric conversion part
110a: junction layer
130, 130a: side insulating layer
42: first electrode
44: second electrode

DESCRIPTION OF EMBODIMENTS

Embodiments of the present disclosure will be described in detail below with reference to the accompanying drawings. However, the present disclosure is not limited to such embodiments, and may be modified into various forms.

In the drawings, in order to clearly and briefly describe the present disclosure, the illustration of parts irrelevant to the description is omitted, and the same reference numerals are used for the same or extremely similar parts throughout the specification. In addition, in the drawings, a thickness, a width, etc., are enlarged or reduced in order to make the description more clear, and the thickness, the width, or the like of the present disclosure are not limited to those illustrated in the drawings.

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

A solar cell and a method for manufacturing a solar cell according to some embodiments of the present disclosure will be described in detail below with reference to the accompanying drawings.

Figure 2:
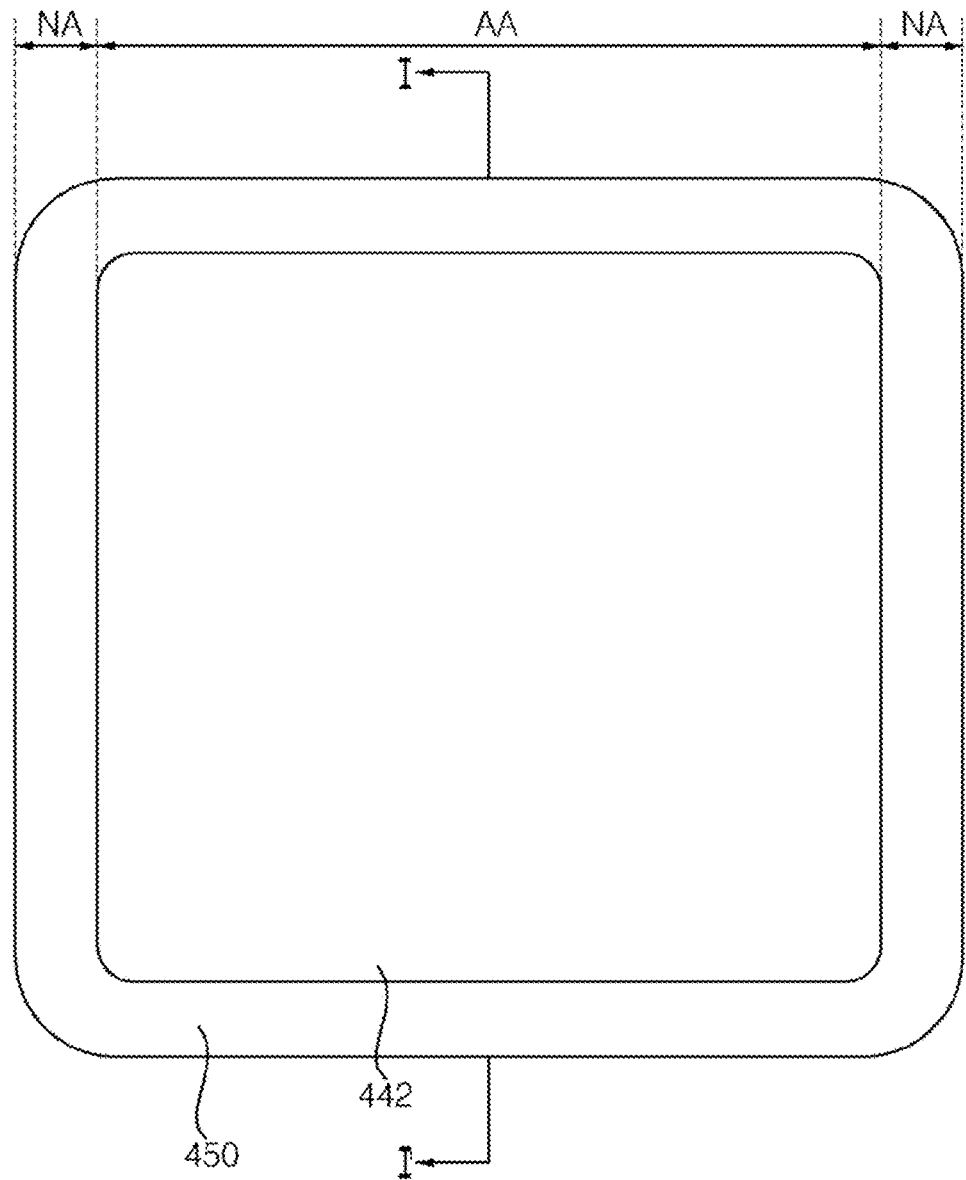
FIG. 2 is a rear view of the solar cell according to some embodiments of the present disclosure.
Figure 3:
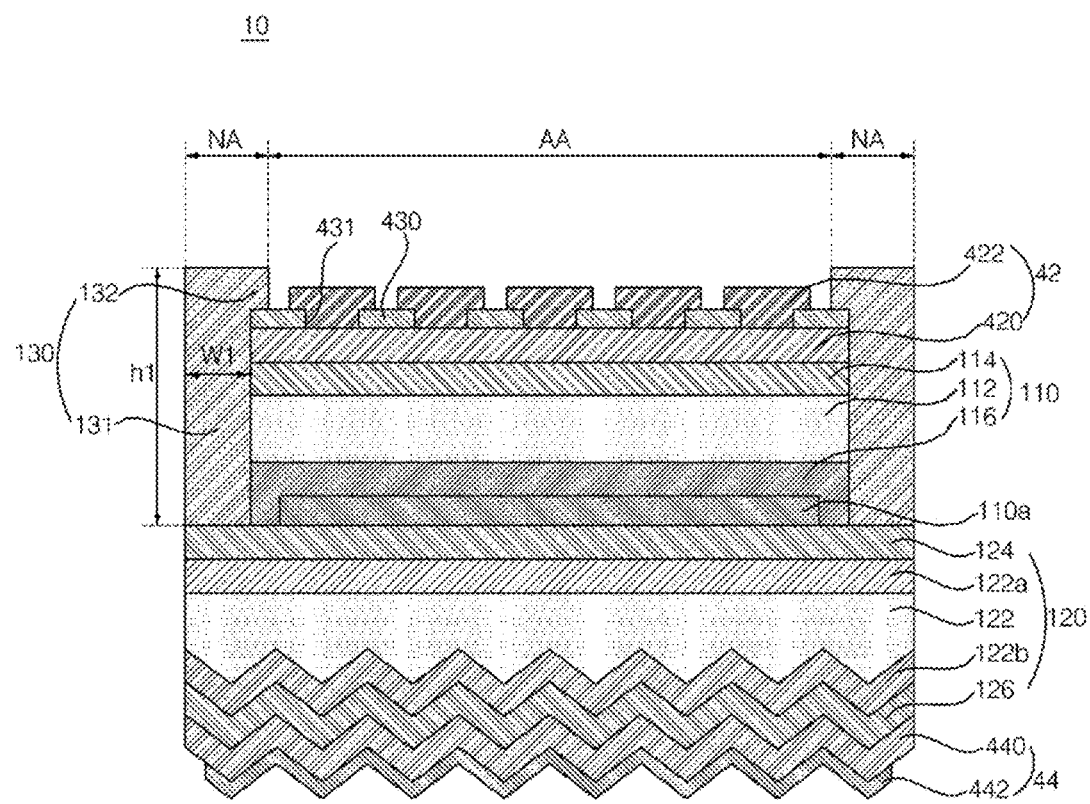
FIG. 3 is a cross-sectional view of the solar cell taken along line I-I' in FIG. 1.

FIG. 1 is a plan view of a solar cell according to some embodiments of the present disclosure, FIG. 2 is a rear view of the solar cell according to some embodiments of the present disclosure, and FIG. 3 is a cross-sectional view of the solar cell in FIG. 1 taken along line I-I'.

A solar cell 10 according to some embodiments of the present disclosure serves as a tandem solar cell 10. In a vertical direction as a stacking direction, the solar cell 10 may include a first photoelectric conversion part 110 including a photoelectric conversion layer 112 composed of a perovskite compound, and a first electrode 42 and a second electrode 44 that are electrically connected to the first photoelectric conversion part 110. Herein, the photoelectric conversion layer 112 composed of the perovskite compound may be formed as a thick film having a thickness greater than a predetermined thickness, and may be formed to have a uniform composition in the stacking direction. In addition, the solar cell 10 according to this embodiment may have a tandem structure and further include the second photoelectric conversion part 120 having a material or structure different from that of the first photoelectric conversion part 110. In addition, the solar cell 10 according to this embodiment, as a large-area solar cell, may form a large-area perovskite solar cell 10 with a diameter ranging from 10 cm to 20 cm, preferably ranges from 12 cm to 17 cm.

As shown in FIG. 1 and FIG. 2, the solar cell 10 according to this embodiment defines, on a plane, at least one solar cell active region AA as a region provided with conductive regions and electrodes where photoelectric conversion substantially occurs, and a non-active region NA is positioned in a periphery region surrounding the active region AA of the solar cell. Such solar cell 10 may form a side insulating layer along the non-active region NA, and have a structure capable of preventing short circuiting due to penetration of moisture into the active region of the solar cell.

Firstly, after a sectional structure of the active region AA of the solar cell is described with reference to FIG. 3, a specific planar shape in the solar cell 10 is described in detail with reference to FIG. 1 and FIG. 2 again.

Referring to FIG. 3, in the solar cell 10 according to this embodiment, the second photoelectric conversion part 120 may have a pn junction structure including a semiconductor substrate 122. As an example, the second photoelectric conversion part 120 may include a semiconductor substrate 122, and conductive regions 124 and 126 formed in the semiconductor substrate 122 or on the semiconductor substrate 122. The conductive regions 124 and 126 may include a first conductive region 124 having a first conductivity type and a second conductive region 126 having a second conductivity type.

The semiconductor substrate 122 may be composed of a crystalline semiconductor (e.g., a monocrystalline or polycrystalline semiconductor, monocrystalline or polycrystalline silicon as an example) including a single semiconductor material (a Group IV element as an example). Then, based on the semiconductor substrate 122 with high crystallinity and few defects, the second photoelectric conversion part 120 may have excellent electrical properties. As an example, the second photoelectric conversion part 120 may have a crystalline silicon solar cell structure.

A front surface and/or a back surface of the semiconductor substrate 122 may be textured to have unevenness. The uneven structure may have, for example, a pyramid shape in which a surface constituting the outer surface of the semiconductor substrate 122 is configured as a (111) surface of the semiconductor substrate 122 and has an irregular size. Thereby, when surface roughness is relatively large, reflectance of light may be lowered. However, the present disclosure is not limited thereto.

In this embodiment, the semiconductor substrate 122 may include a base region having a first or second conductivity type by being doped with a first or second conductivity dopant having doping concentration lower than that of the first semiconductor layer 124 or the second semiconductor layer 126. That is, the semiconductor substrate 122 may include only the base region without a doping region formed by additionally doping the base region with a dopant.

A first passivation film 122a is formed on the front surface of the semiconductor substrate 122, and a second passivation film 122b is formed on the back surface of the semiconductor substrate 122.

The first passivation film 122a and the second passivation film 122b may act as a barrier for electrons and holes so as not to prevent minority carriers from passing, and after accumulation in a portion adjacent to the first passivation film 122a and the second passivation film 122b, only majority carriers with energy above a predetermined amount pass through the first passivation film 122a and the second passivation film 122b. As an example, the first passivation film 122a and the second passivation film 122b may be a tunneling film. In this case, the majority carriers with energy above the predetermined amount can easily pass through the first passivation film 122a and the second passivation film 122b due to a tunneling effect.

The first passivation film 122a or the second passivation film 122b may include various materials that allow carriers to tunnel, and as an example, may include nitrides, semiconductors, conductive polymers, and the like. For example, the first passivation film 122a or the second passivation film 122b may include a silicon oxide, a silicon nitride, a silicon oxynitride, an intrinsic amorphous semiconductor (intrinsic amorphous silicon as an example), an intrinsic polycrystalline semiconductor (intrinsic polysilicon as an example), and the like. In this case, the first passivation film 122a and the second passivation film 122b may include an intrinsic amorphous semiconductor. As an example, the first passivation film 122a and the second passivation film 122b may be formed as an amorphous silicon (a-Si) layer, an amorphous silicon carbide (a-SiC$_x$) layer, an amorphous silicon oxide (a-SiO$_x$) layer, or the like. Then, since the first passivation film 122a and the second passivation film 122b have similar properties to the semiconductor substrate 122, surface properties of the semiconductor substrate 122 can be more effectively improved.

In this case, the first passivation film 122a and the second passivation film 122b may be entirely formed on the front surface and the back surface of the semiconductor substrate 122, respectively. Therefore, the front surface and the back surface of the semiconductor substrate 122 can be entirely passivated, and can be easily formed without additional patterning. Thicknesses of the passivation films 122a and 122b may be less than those of the conductive regions 124 and 126 (below 5 nm as an example) to sufficiently achieve the tunneling effect. However, the present disclosure is not limited thereto, and the passivation films 122a and 122b may have a variety of materials, shapes, thicknesses, and the like.

However, according to this embodiment, the passivation film 122a may be omitted.

The first conductive region 124 having the first conductivity type may be formed (contact as an example) on the first passivation film 122a. In addition, the second conductive region 126 having the second conductivity type opposite to the first conductivity type may be positioned (contact as an example) on the second passivation film 122b.

The first conductive region 124 may be a region including a first-conductivity-type dopant and having the first conductivity type. In addition, the second conductive region 126 may be a region including a second-conductivity-type dopant and having the second conductivity type.

The first conductive region 124 and the second conductive region 126 may respectively include a same semiconductor material as the semiconductor substrate 122 (in some embodiments, a single semiconductor material, silicon as an example). As an example, the first conductive region 124 and the second conductive region 126 may be formed as an amorphous silicon (a-Si) layer, an amorphous silicon carbide (a-SiC$_x$) layer, an amorphous silicon oxide (a-SiO$_x$) layer, or the like. Then, differences in properties that may occur when the first conductive region 124 and the second conductive region 126 have similar properties to the semiconductor substrate 122 but include semiconductor materials different from each other can be minimized. However, the first conductive region 124 and the second conductive region 126, which are separately formed on the semiconductor substrate 122 with respect to the semiconductor substrate 122, may have a crystal structure different from that of the semiconductor substrate 122 so as to be easily formed on the semiconductor substrate 122.

For example, each of the first conductive region 124 and the second conductive region 126 may be formed by doping the first- or second-conductivity-type dopant into an amorphous semiconductor or the like that can be easily manufactured with various methods such as deposition. Then, the first conductive region 124 and the second conductive region 126 may be easily formed through a simple process. In this case, the first passivation film 122a and the second passivation film 122b, when composed of an intrinsic amorphous semiconductor (intrinsic amorphous silicon as an example), may have excellent adhesive properties, excellent electrical conductivity, and the like. In addition, each of the first conductive region 124 and the second conductive region 126 may be manufactured into a nanocrystalline silicon or polysilicon layer with various methods such as deposition, and may be formed by doping the first-conductivity-type dopant or the second-conductivity-type dopant. Then, the first conductive region 124 and the second conductive region 126 may be easily formed through a simple process. In this case, the first passivation film 122a and the second passivation film 122b, when composed of an intrinsic amorphous semiconductor (intrinsic amorphous silicon as an example), may have excellent adhesive properties, excellent electrical conductivity, and the like.

In this embodiment, when the semiconductor substrate 122 (or the base region) has the first conductivity type, the second conductive region 126 may constitute an emission region forming a pn junction with the semiconductor substrate 122. The first conductive region 124 may constitute a front surface field region in which a front surface field is formed to prevent recombinations. Then, since the emission region directly involved in photoelectric conversion is located on the back surface, the emission region may be formed with a sufficient thickness (formed to be thicker than the front electric field region as an example) to further improve photoelectric conversion efficiency. However, the present disclosure is not limited thereto. Since the semiconductor substrate 122 has the second conductivity type, the first conductive region 124 may also constitute an emitter region, and the second conductive region 126 may also constitute a back surface field region.

In this embodiment, the first conductive region 124 and the semiconductor substrate 122 may have an n type, and the second conductive region 126 may have a p type. Then, in the first photoelectric conversion part 110 located on the second photoelectric conversion part 120, a first transport layer 114 located at an upper part may transport electrons, and a second transport layer 116 located at a lower part may transport holes. Compared with an opposite case, in this case, the first photoelectric conversion part 110 may bring an excellent effect. In addition, the semiconductor substrate 122 may have an n type, thereby prolonging the life time of the carriers. However, the present disclosure is not limited thereto, and the semiconductor substrate 122 has either the first conductivity type or the second conductivity type, or has either the n type or the p type, which may be modified in a variety of manners.

A junction layer (tunneling junction layer) 110a is located on a front surface of the second photoelectric conversion part 120 to connect the second photoelectric conversion part 120 with the first photoelectric conversion part 110 located thereabove. Although it is shown in the drawing that the junction layer 110a is in direct contact with the first conductive region 124 and the first photoelectric conversion part 110 respectively, the present disclosure is not limited thereto. The junction layer 110a may have a thin thickness, as an example, a thickness thinner than thicknesses of the electrode layers 420 and 440, so that the carriers can tunnel smoothly.

The junction layer 110a may electrically connect the first photoelectric conversion part 110 with the second photoelectric conversion part 120, and may include a material allowing light (long-wavelength light as an example) used in the first photoelectric conversion part 110 to pass through. As an example, the junction layer 110a may include at least one of a transparent conductive material (transparent conductive oxide as an example), a conductive carbon material, a conductive polymer, and n-type or p-type amorphous silicon. In some other embodiments, the junction layer 110a may be formed as a structure in which silicon layers having different refractive indexes from each other are alternately stacked, so light (short-wavelength light as an example) used in the second photoelectric conversion part 120 can be reflected by the second photoelectric conversion part 120 and light (long-wavelength light as an example) used in the first photoelectric conversion part 110 may be transmitted to the first photoelectric conversion part 110.

The junction layer 110a is formed to have an area smaller than that of the second photoelectric conversion part 120, and an area of the first photoelectric conversion part 110 formed above the junction layer 110a has an area the same as or smaller than that of the junction layer 110a.

Therefore, a step is formed around the first photoelectric conversion part 110 due to the difference between the area of the second photoelectric conversion part 120 and the area of the first photoelectric conversion part 110, so as to form, at an edge, a step region NA exposing the second photoelectric conversion part 120 below.

The step region NA as described above may be formed on edges of four side surfaces which are centered on the active region AA in a central region, and thus has a frame shape.

When the first photoelectric conversion part 110 is formed on the second photoelectric conversion part 120 by a deposition process, the four side surfaces of the solar cell 10 as described above are formed to include a region where two legs of a fixing portion of a deposition machine that fix the semiconductor substrate 122 of the solar cell 10 in the deposition machine are located on the semiconductor substrate 122.

Therefore, the fixing portion of the deposition machine is located in at least one of step regions NA formed on the four side surfaces of the solar cell 10 in a length direction.

Therefore, the junction layer 110a and the first photoelectric conversion part 110 including the photoelectric conversion layer 112 composed of the perovskite compound may be positioned while the step region NA as described above is formed on the second photoelectric conversion part 120. The first photoelectric conversion part 110 is also only formed on the junction layer 110a to maintain the step region NA, so as to keep the area difference between the second photoelectric conversion part 120 and the first photoelectric conversion part 110 constant.

In this case, as shown in FIG. 3, the junction layer 110a may have a same area as the first photoelectric conversion part 110 formed thereabove, but in some other embodiments, the junction layer 110a may be formed to have a smaller area than the first photoelectric conversion part 110, and the first photoelectric conversion part 110 may be formed in the step region NA while covering the junction layer 110a as described above.

As described above, when the area of the first photoelectric conversion part 110 is larger than that of the junction layer 110a, the area of the first photoelectric conversion part 110 and the area of the second photoelectric conversion part 120 are also different to form a step region NA.

For example, the first photoelectric conversion part 110 may include a photoelectric conversion layer 112, a second transport layer (second carrier transport layer) 116 on one side of the photoelectric conversion layer 112 and between the junction layer 110a and the photoelectric conversion layer 112, and a first transport layer (first carrier transport layer) 114 on the other side of the photoelectric conversion layer 112 and between the photoelectric conversion layer 112 and the first electrode 42.

The second transport layer 116 located on the junction layer 110a is a layer that extracts and transports a second carrier (a hole as an example) according to a bandgap relationship with the photoelectric conversion layer 112. As an example, the second carrier transported through the second transport layer 116 may pass through the junction layer 110a and move to the first photoelectric conversion part 110.

The photoelectric conversion layer 112 located on the second transport layer 116 may be formed by a perovskite compound having a perovskite structure, and may be a photoactive layer that can be excited by light to generate carriers (electrons and holes). As an example, the perovskite structure may have a chemical formula of $AMX_3$ (herein, A is a monovalent organic ammonium cation or metal cation; M is a divalent metal cation; X means a halogen anion). This photoelectric conversion layer 112 serves as $AMX_3$, which may include $CH_3NH_3PbI_3$, $CH_3NH_3PbI_xCl_{(3-x)}$, $CH_3NH_3PbI_xBr_{(3-x)}$, $CH_3NH_3PbCl_xBr_{(3-x)}$, $HC(NH_2)_2PbI_3$, $HC(NH_2)_2PbI_xCl_{(3-x)}$, $HC(NH_2)_2PbI_xBr_{(3-x)}$, $HC(NH_2)_2PbCl_xBr_{(3-x)}$, and the like, or may include a compound in which A of $AMX_3$ is partially doped with Cs. However, the present disclosure is not limited thereto, and a variety of materials may be used as the photoelectric conversion layer 112.

The photoelectric conversion layer 112 formed by a perovskite compound may have a thickness greater than the predetermined thickness, and may have a greater thickness than the first conductive region 124.

As an example, the predetermined thickness of the photoelectric conversion layer 112 may be formed to have a thickness of 400 nm to 800 nm or more, but is not limited thereto.

However, when the photoelectric conversion layer 112 is formed as a thick film having a thickness greater than a predetermined thickness, photoelectric efficiency can be improved, and the photoelectric conversion layer 112, when transferred in the stacking direction, may be formed to have a perovskite structure from a region in contact with the second transport layer 116 to a region in contact with the first transport layer 114 while the composition of the perovskite compound is maintained in the stacking direction.

Therefore, in a boundary region serving as the region in contact with the first transport layer 114 or the region in contact with the second transport layer 116, a raw material layer for forming the perovskite compound does not remain. Therefore, the problem of carrier blockage caused by the residue of the raw material layer is eliminated, so that a large-area thick film can be formed while the photoelectric efficiency is ensured.

The first transport layer 114 located on the photoelectric conversion layer 112 is a layer that extracts and transports a first carrier (an electron as an example) through a bandgap relationship with the photoelectric conversion layer 112.

The first electrode 42 may be located on the first photoelectric conversion part 110 (on the first transport layer 114 on the front surface thereof as an example), and the second electrode 44 may be located on the second photoelectric conversion part 120 (the second conductive region 126 on the back surface thereof as an example). That is, the solar cell 10 according to this embodiment may have a tandem structure in which the second photoelectric conversion part 120 based on a single semiconductor material (silicon as an example) is bonded to the first photoelectric conversion part 110 based on a perovskite compound through the junction layer 110a.

In this embodiment, the first photoelectric conversion part 110 has a larger bandgap than the second photoelectric conversion part 120. That is, the first photoelectric conversion part 110 has a relatively large bandgap to absorb a short wavelength that has a relatively small wavelength and use the short wavelength to perform photoelectric conversion, and the second photoelectric conversion part 120 has a bandgap lower than that of the first photoelectric conversion part 110 to effectively absorb a long wavelength that has a wavelength larger than that of the light used in the first photoelectric conversion part 110 and use the long wavelength to perform the photoelectric conversion.

In more detail, when light passes through the front surface of the solar cell 10 and enters the solar cell 10, the first photoelectric conversion part 110 absorbs short wavelengths to generate electrons and holes through photoelectric conversion. In this case, the first carrier (an electron as an example) moves to the first electrode 42 side and is collected, and the second carrier (a hole as an example) passes through the first photoelectric conversion part 110 and the second photoelectric conversion part 120, moves to the second electrode 44, and is collected. When the long wavelength not used in but passing through the first photoelectric conversion part 110 reaches the second photoelectric conversion part 120, the second photoelectric conversion part 120 absorbs the long wavelength and generates electrons and holes by the photoelectric conversion. In this case, the first carrier (an electron as an example) passes through the first photoelectric conversion part 110, moves to the first electrode 42 side, and is collected, and the second carrier (a hole as an example) moves to the second electrode 44 side and is collected.

As described above, in this embodiment, since light having various wavelengths can be used in the photoelectric conversion parts 110 and 120, the efficiency of the solar cell can be greatly improved. In particular, in this embodiment, a variety of properties may be improved by including the first photoelectric conversion part 110 based on a perovskite compound and the second photoelectric conversion part 120 having a hetero-junction structure. As an example, both the first photoelectric conversion part 110 and the second photoelectric conversion part 120 above may be formed in a low-temperature process, and it is easy to adjust a temperature range due to similar process temperatures, so process matching is achieved. In addition, since the first photoelectric conversion part 110 and the second photoelectric conversion part 120 above respectively have excellent open voltages, the efficiency of the solar cell 10 with a tandem structure can be greatly improved. A variety of structures are applicable to the second photoelectric conversion part 120, and a variety of other modifications are possible.

In this embodiment, the first photoelectric conversion part 110 may be formed by a low-temperature process (a low-temperature process below 200° C. as an example), a temperature from room temperature to below 150° C. as an example, and in an embodiment, room temperature (a temperature above 20° C. and below 150° C. as an example).

The first electrode 42 may include a first electrode layer 420 and a second electrode layer 422 sequentially stacked on the photoelectric conversion parts 110 and 120. As an example, the first electrode layer 420 may be entirely formed (contact as an example) on the first photoelectric conversion part 110 (for example, the first transport layer 114). "Entirely formed" may include not only a case where the entirety of the first photoelectric conversion part 110 is covered without a blank space or blank region, but also a case where no part is formed inevitably. As described above, when the first electrode layer 420 is entirely formed on the first conductive region 124, the carriers can easily reach the second electrode layer 422 through the first electrode layer 420, thereby reducing resistance in a horizontal direction.

As described above, the first electrode layer 420 is entirely formed on the first photoelectric conversion part 110, and thus may be composed of a material that can transmit light (a light-transmitting material). That is, the first electrode layer 420 is composed of a transparent conductive material to allow the carriers to move easily while enabling transmission of the light. Therefore, the first electrode layer 420 is entirely formed on the first photoelectric conversion part 110 and does not block the transmission of the light. As an example, the first electrode layer 420 may include a transparent conductive material (for example, a transparent conductive oxide, an indium tin oxide (ITO) or the like as an example), a carbon nano tube (CNT), and the like. However, the present disclosure is not limited thereto, and the first electrode layer 420 may include a variety of other materials.

The second electrode layer 422 may be formed (contact as an example) on the first electrode layer 420. Second electrode layers 422a and 422b may be composed of a material having better electrical conductivity than the first electrode layer 420. Therefore, properties such as carrier collection efficiency and resistance reduction according to the second electrode layer 422 can be further improved. As an example, the second electrode layer 422 may be composed of an opaque metal having excellent electrical conductivity, or a metal having lower transparency than the first electrode layer 420.

As described above, the second electrode layer 422 is opaque or has low transparency and hinders incidence of light, and thus may have a predetermined pattern to minimize a shading loss. Therefore, light can be incident on a portion where the second electrode layer 422 is not formed.

In this embodiment, the second electrode layer 422 may be formed of an alloy having at least one of Ag, Cu, Al, Mo, Ti, Pd, W, and Pt, and may be formed by a deposition process.

The deposition process for forming the second electrode layer 422 may be vacuum deposition, sputtering, or electroplating. In this case, the second electrode layer 422 formed by deposition may be formed to have a thickness less than 5 μm. The second electrode layer 422 may be a structure including a plurality of layers, but is not limited thereto.

In addition, the second electrode layer 422 may also be formed as a paste electrode, and in this case, an electrode material may be formed by sintering metal powder including Ag, Cu, Al, Sn, and the like.

The second electrode layer 422 may have various planar shapes.

As an example, as shown in FIG. 1, the second electrode layer 422 may include a plurality of finger electrodes 422a spaced apart from each other while each having a predetermined pitch. Although it is illustrated in the drawing that the finger electrodes 422a are parallel to each other and parallel to edges of the photoelectric conversion parts 110 and 120 (the semiconductor substrate 122 as an example), the present disclosure is not limited thereto, which may also be formed as oblique lines. In addition, the second electrode layer 422 may include busbar electrodes 422 (which are dominant in an electrode structure and thus are denoted by the same reference sign as the second electrode layer) formed in a direction intersecting the finger electrodes 422a and connected to the finger electrodes 422a. In some embodiments, only one busbar electrode 422 may be provided, or a plurality of busbar electrodes 42b may be provided while having a pitch larger than that of the finger electrodes 422a as shown in FIG. 2. In this case, a width of the busbar electrode 422 may be greater than that of the finger electrode 422a, but the present disclosure is not limited thereto. Therefore, the width of the busbar electrode 422 may be equal to or less than that of the finger electrode 422a.

A plurality of busbar electrodes 422 may be formed parallel to each other in a first direction, and the busbar electrodes 422 adjacent to each other may be formed to have a spacing w2 greater than that between the finger electrodes 422a.

In addition, the plurality of busbar electrodes 422 as described above may serve as pad portions in contact with corresponding leads 20 performing electrical and physical bonding with an adjacent solar cell 10.

In addition, the second electrode 44 may be located on the second photoelectric conversion part 120, and as shown in FIG. 2, may have a double-layer structure including a first electrode layer 440 and a second electrode layer 442.

A function, a material, a shape, and the like of the first electrode layer 440 of the second electrode 44 are the same as or similar to those of the first electrode layer 420 of the first electrode 42, so the description thereof can be applied as it is.

The second electrode layer 442 of the second electrode 44 may have a planar shape the same as or different from that of the first electrode 42. For example, like the finger electrodes 422a and the busbar electrodes 422 of the first electrode 42, the second electrode layer 442 may be patterned into finger electrodes and busbar electrodes, and in some other embodiments, like the first electrode layer 440, the second electrode layer 442 may be formed on the entire second photoelectric conversion part 120. A variety of other modifications are available.

In addition, an antireflection film 430 may be formed on the first electrode layers 420 and 440 of the first electrode 42 and the second electrode 44 to expose only part of the first electrode layers 420 and 440, so that the second electrode layers 422 and 442 are in contact with the first electrode layers 420 and 440.

In addition, as shown in FIG. 3, a side insulating layer 130 (131 and 132) is formed in the step region NA formed at four edges of the first photoelectric conversion part 110.

The side insulating layer 130 may be formed to have a thickness equal to or greater than a height h1 from the top of the second photoelectric conversion part 120 to the top of the first photoelectric conversion part 110 (i.e., a thickness of the first photoelectric conversion part 110). In some embodiments, the thicknesses h1 of the side insulating layers 130a and 130b may range from 10 nm to 1 μm.

The side insulating layers 130 are identically formed in four step regions NA, so as to be formed, in the four side surfaces of one solar cell 10, to have a frame shape surrounding the first photoelectric conversion part 110 therein.

The side insulating layer 130 may be formed by atomic deposition, chemical deposition, or physical deposition, and may alternatively be formed by coating insulating paste, but is not limited thereto. A width W1 of the side insulating layer 130 has a smaller-the-better type characteristic, but according to necessity thereof, the width W1 of the side insulating layer 130 on one side surface may satisfy a range from 0.1 mm to 3.0 mm, which may be adjusted according to a size of the fixing portion of the deposition machine.

The side insulating layer 130 may be formed of a compound including oxide, nitride, and the like, and as an example, $Al_2O_3$, SiC, SiN, or the like is applicable.

The side insulating layer 130 as described above may include a side surface portion 131 filling the step region NA and forming a frame and a covering portion 132 bending from the side surface portion 132 towards a light-receiving surface of the first photoelectric conversion part 110 in a center and partially covering the first photoelectric conversion part 110.

The covering portion 132 as described above may be formed to have a width narrower than that of the side surface portion 131, and cover an edge on the antireflection film 430 of the first photoelectric conversion part 110, thereby preventing penetration of moisture into the first photoelectric conversion part 110 from the outside.

The solar cell 10 according to this embodiment may be separated and used as a plurality of solar cells, but is not limited thereto. As described above, when the solar cell 10 is split into two solar cells, a (cell to module loss) CTM loss may be reduced when a plurality of solar cells are connected to manufacture a solar cell module.

A method for manufacturing the tandem solar cell in FIG. 1 to FIG. 3 will be described in detail below with reference to FIG. 4 to FIG. 8b.

Figure 4:
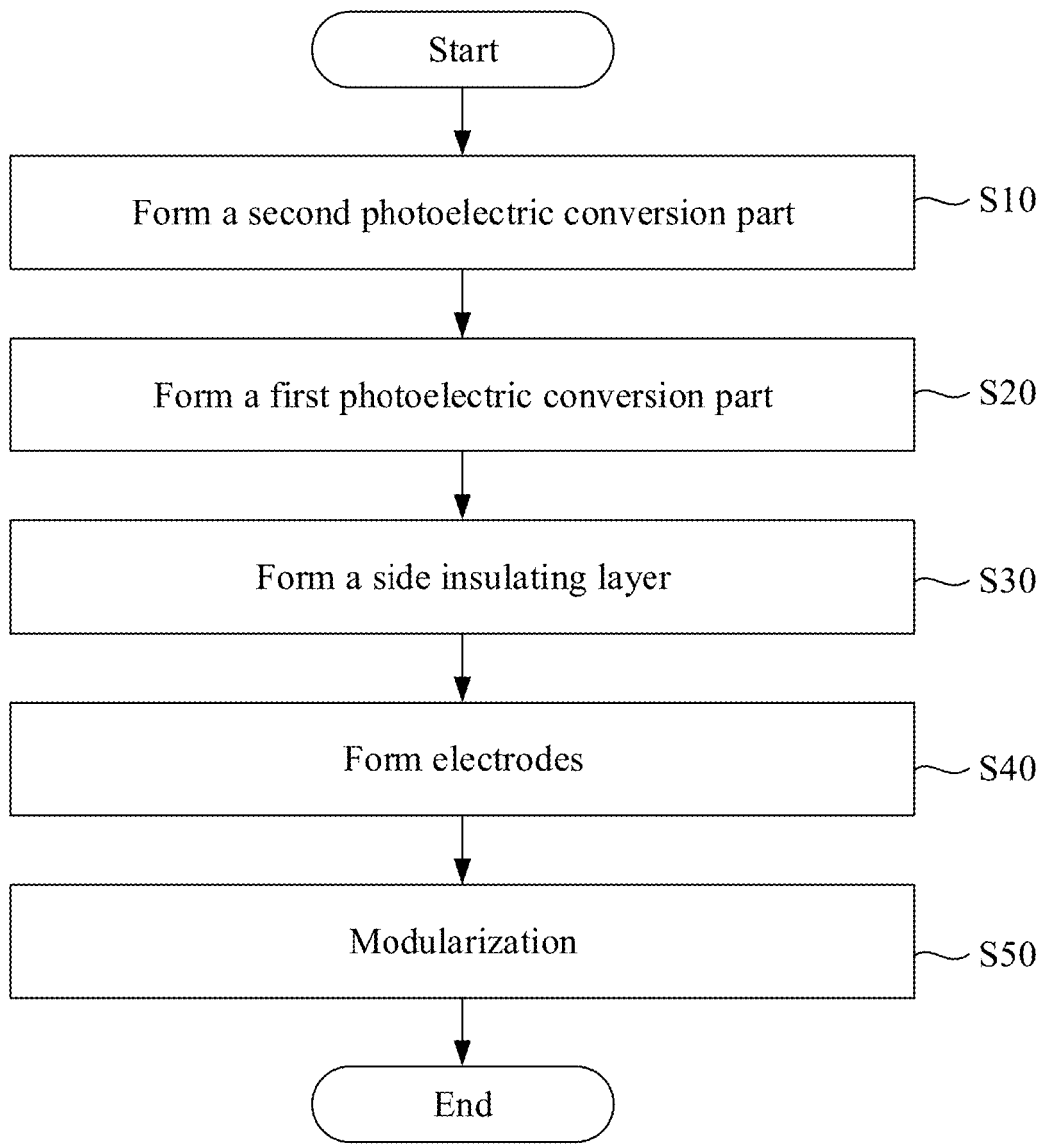
FIG. 4 is a flowchart of a method for manufacturing the solar cell according to some embodiments of the present disclosure.

FIG. 4 is a flowchart of the method for manufacturing the solar cell according to some embodiments of the present disclosure, and FIG. 5a to FIG. 8b are process diagrams for manufacturing the solar cell according to some embodiments of the present disclosure.

As shown in FIG. 4, a method for manufacturing the solar cell according to some embodiments of the present disclosure includes a step of forming a second photoelectric conversion part (S10), a step of forming a first photoelectric conversion part (S20), a step of forming a side insulating layer (S30), a step of forming a first electrode and a second electrode (S40), and a step of modularization (S50). The method will be described in more detail.

Figure 5A:
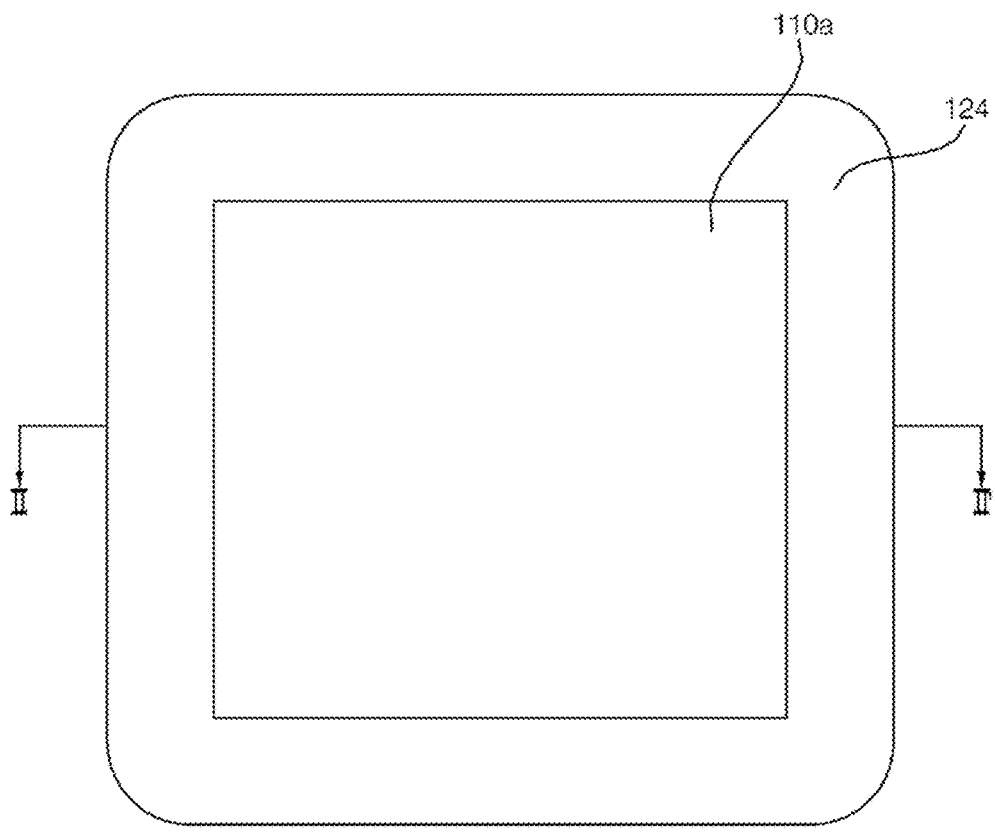
FIG. 5a to FIG. 8b are diagrams showing processes in the method for manufacturing the solar cell according to some embodiments of the present disclosure.
Figure 5B:
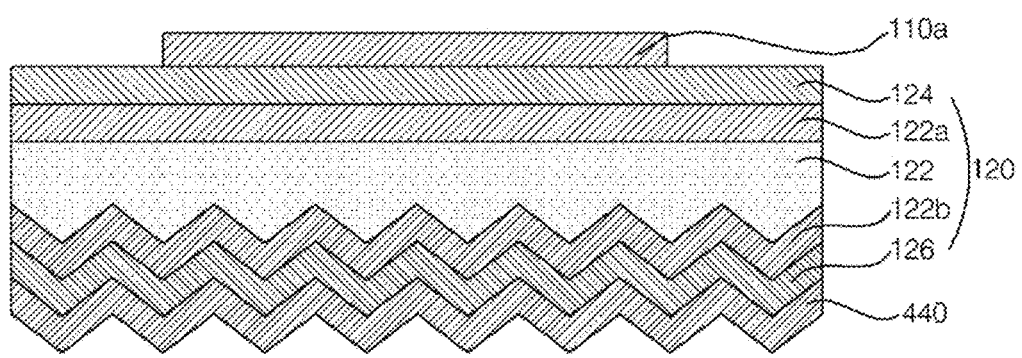

As shown in FIG. 5a and FIG. 5b, in the step of forming a second photoelectric conversion part 120 (S10), the second photoelectric conversion part 120 including a semiconductor substrate 122, a first conductive region 124, a second conductive region 126, and the like is formed from the semiconductor substrate 122.

Firstly, the semiconductor substrate 122 formed as a base region having a first or second conductivity type dopant is manufactured. In this case, at least one of a front surface and a back surface of the semiconductor substrate 122 may be textured to have unevenness as an antireflection structure. Wet or dry texturing may be used for the texturing of the surface of the semiconductor substrate 122. The wet texturing may be performed by immersing the semiconductor substrate 122 in a texturing solution, and has an advantage of a short process time. In the dry texturing, the surface of the semiconductor substrate 122 is cut using a diamond grill, a laser, or the like, which may uniformly form the unevenness, but may have a long process time and cause damages to the semiconductor substrate 122. In addition, the semiconductor substrate 122 may be textured by reactive ion etching (RIE) or the like. As described above, in the present disclosure, the semiconductor substrate 122 may be textured with various methods.

Next, conductive regions 124 and 126 are formed on the surfaces of the semiconductor substrate 122. For example, a first passivation film 122a and the first conductive region 124 are formed on the front surface of the semiconductor substrate 122, and a second passivation film 122b and the second conductive region 126 are formed on the back surface of the semiconductor substrate 122.

The conductive regions 124 and 126 may be formed by thermal growth, deposition (e.g., plasma enhanced chemical vapor deposition (PECVD) or atomic layer deposition (ALD)), low-pressure chemical vapor deposition (LPCVD)), or the like. However, the present disclosure is not limited thereto.

The first or second conductivity type dopant may also be included in a process of growing semiconductor layers forming the conductive regions 124 and 126, and may also be doped by ion implantation, thermal diffusion, laser doping, or the like after formation of the semiconductor layers. However, the present disclosure is not limited thereto, and the conductive regions 124 and 126 may be formed with various methods.

Next, as shown in FIG. 5b, a protective layer is formed on the second conductive region 126. In this case, in this embodiment, the first electrode layer 440 of the second electrode 44 may be formed as the protective layer on the second conductive region 126. The first electrode layer 440 functions as a protective layer in the second conductive region 126 to protect the second conductive region 126 in the manufacturing process, and may remain as it is to function as the first electrode layer 440. That is, in this embodiment, prior to the formation of the first photoelectric conversion part 110, the first electrode layer 440 of the second electrode 44 is formed to be used as the protective layer, thereby simplifying the process. However, the present disclosure is not limited thereto, a protective layer different from the first electrode layer 440 may be formed separately, and the first electrode layer 440 may be formed in a state where the protective layer is removed or not removed.

As an example, the first electrode layer 440 of the second electrode 44 may be formed by sputtering. A sputtering process may be performed at a low temperature, and the first electrode layer 440 of the second electrode 44 may be formed only on a back surface as a single side. However, the present disclosure is not limited thereto, and various methods such as a coating method are applicable.

Next, a junction layer 110a is formed on the second photoelectric conversion part 120. For example, the junction layer 110a may be formed on part of the first conductive region 124 of the second photoelectric conversion part 120. As an example, the junction layer 110a may be formed by sputtering. A sputtering process may be performed at a low temperature, and as a single-sided process, the junction layer 110a may be formed only on the second conductive region 124. However, the present disclosure is not limited thereto, and various methods such as a coating method are applicable.

The junction layer 110a may be formed to have an area smaller than that of the second photoelectric conversion part 120 and smaller than that of the first photoelectric conversion part 110, which, in some other embodiments, may be formed to have a same area as the first photoelectric conversion part 110.

The junction layer 110a may be formed only in the central region while exposing the edge region of the second photoelectric conversion part 120 by sputtering after a mask (not shown) is placed, but is not limited thereto, which may be formed with a variety of methods.

Figure 6A:
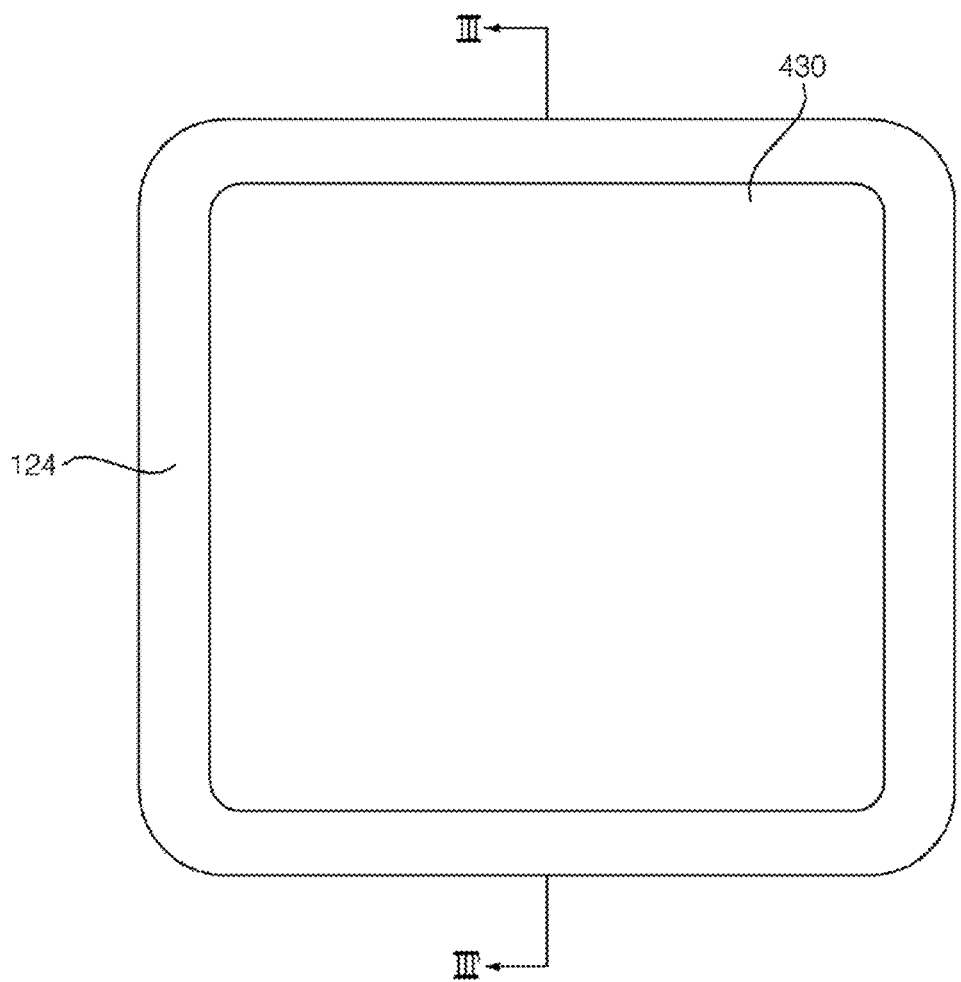
Figure 6B:
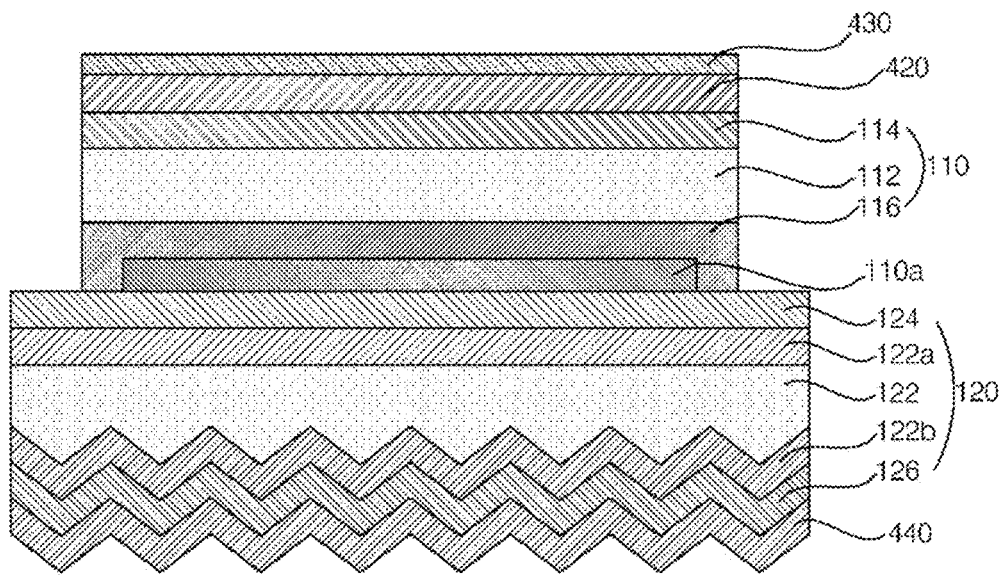
Figure 6C:
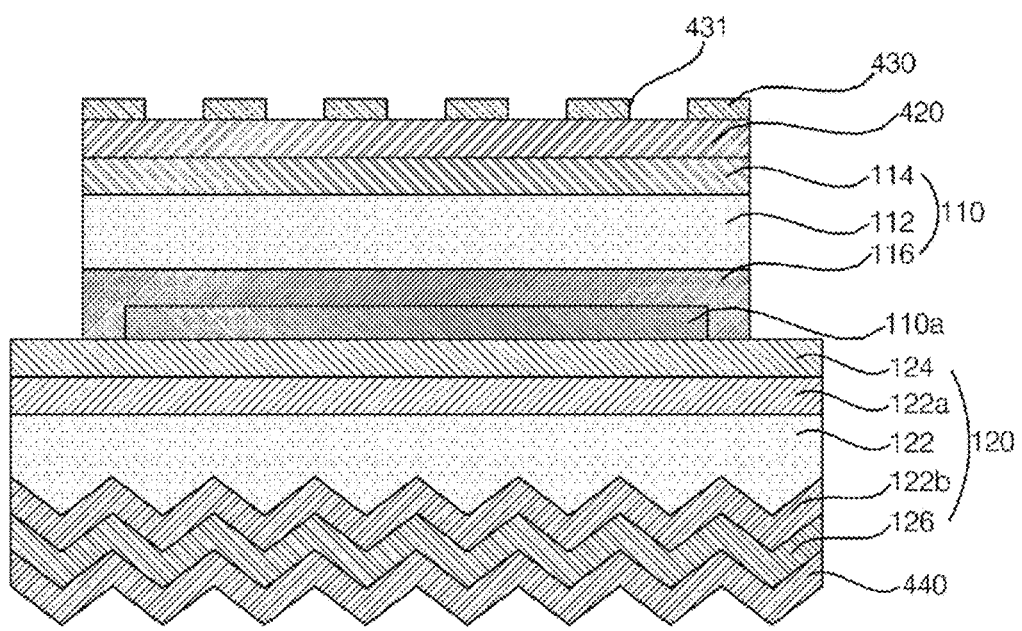

Next, as shown in FIG. 6a, FIG. 6b, and FIG. 6c, a first photoelectric conversion part 110 is formed on the junction layer 110a (S20).

In the step of forming the first photoelectric conversion part 110, the first photoelectric conversion part 110 is formed on the junction layer 110a. In this case, the first photoelectric conversion part 110 is selectively formed to have an area larger than that of the junction layer 110a and smaller than that of the second photoelectric conversion part 120 while exposing four edge regions.

For example, on the junction layer 110a in the deposition device, a second transport layer 116, a photoelectric conversion layer 112, and a first transport layer 114 may cover the junction layer 110a and be sequentially formed.

The second transport layer 116, the photoelectric conversion layer 112, and the first transport layer 114 may be formed by deposition (such as physical deposition or chemical deposition).

Next, a first electrode layer 420 of a first electrode 42 may be formed on the first photoelectric conversion part 110. For example, the first electrode layer 420 of the first electrode 42 may be formed on the first transport layer 114.

As an example, the first electrode layer 420 of the first electrode 42 may be formed by sputtering. A sputtering process may be performed at a low temperature, and the first electrode layer 420 of the first electrode 42 may be formed only on a front surface as a single side. However, the present disclosure is not limited thereto, and various methods such as a coating method are applicable.

In addition, in this embodiment, it is illustrated that a first electrode layer 440 of a second electrode 44 is formed prior to the formation of the first photoelectric conversion part 110, and the first electrode layer 420 of the first electrode 42 is formed after the formation of the first photoelectric conversion part 110. However, the present disclosure is not limited thereto, and the first electrode layer 440 of the second electrode 44 may be formed after the formation of the first photoelectric conversion part 110. In this case, the first electrode layer 440 of the second electrode 44 may be formed simultaneously with the first electrode layer 420 of the first electrode 42. Alternatively, the first electrode layer 440 of the second electrode 44 may be formed prior to or after the formation of the first electrode layer 420 of the first electrode 42. A variety of other modifications are possible.

Next, as shown in FIG. 6b, an antireflection film 430 is formed on the first electrode layer 420. The antireflection film 430 may also be formed by a deposition process, and as shown in FIG. 6c, may be partially patterned to expose a region where the second electrode layer 422 is formed.

Figure 7A:
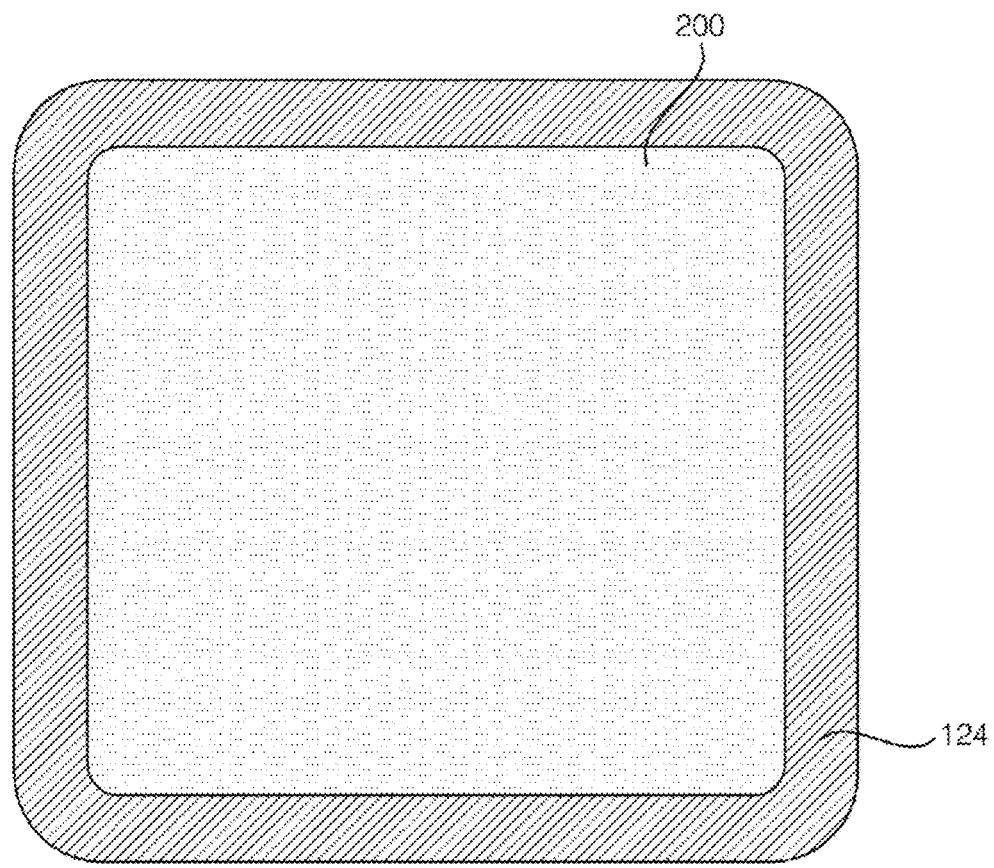
Figure 7B:
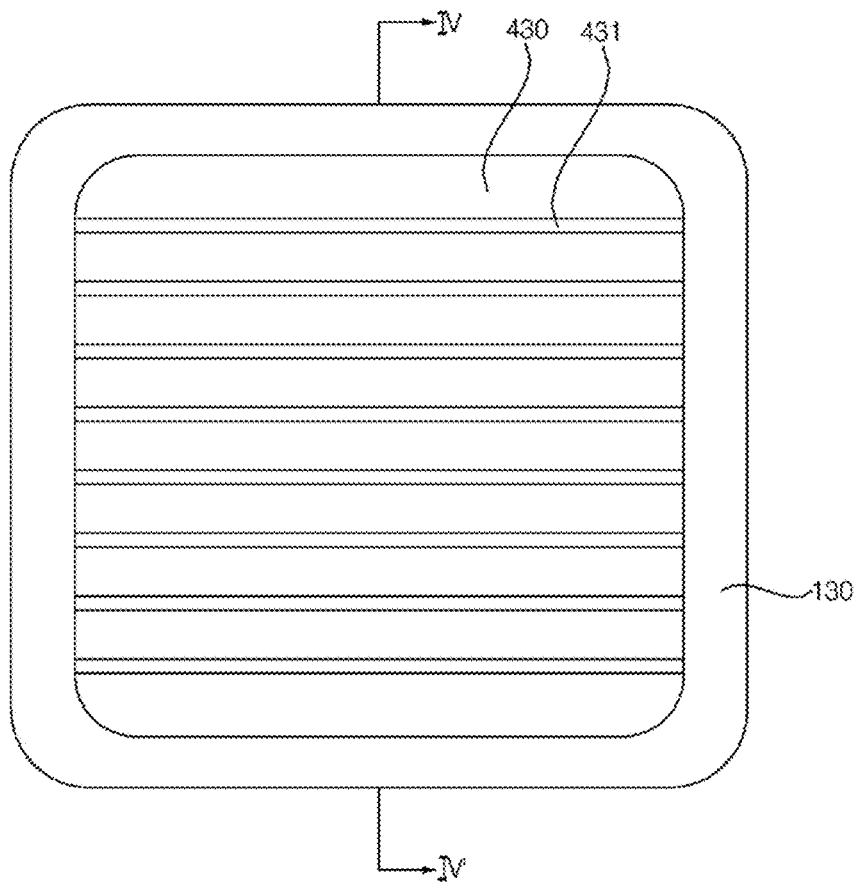

As described above, when an opening portion 431 for bonding the second electrode layer 422 and the first electrode layer 420 is formed on the antireflection film 430, as shown in FIG. 7a and FIG. 7b, the side insulating layer 130 is formed (S30).

Firstly, as shown in FIG. 7a, after the solar cell 10 is mounted in the deposition device, a mask 200 that exposes two side surfaces of the solar cell 10 and covers the central region is loaded on the front surface of the solar cell 10. The mask 200 may be formed of carbide, nitride, or the like, but is not limited thereto.

The side insulating layer 130 is deposited on the exposed side surfaces after alignment to cover the central region of the solar cell 10.

In this case, the mask is formed to be smaller than the antireflection film 430 to partially expose an edge of the antireflection film 430, so that the covering portion 132 of the side insulating layer 130 can be formed simultaneously.

In this case, as the deposition device, various methods such as atomic deposition, physical deposition, and chemical deposition are applicable, and thus, oxides such as $SiO_2$ or carbides or nitrides of SiC or SiN are applicable on the side surface.

In this case, the side portion 131 of the side insulating layer 130 formed may have a thickness H1 satisfying a range from 10 nm to 1 and may be formed to be as high as or higher than the first photoelectric conversion part 110 formed later. In addition, widths W1 of the side insulating layers 130a and 130b may satisfy a range from 0.1 mm to 0.3 mm. Therefore, the width W1 of the side insulating layer 130 may comply with a smaller-the-better condition, but may be adjusted to substantially not exceed 0.3 mm.

As described above, the side insulating layer 130 includes the cover portion 132 to cover the edge of the antireflection film 430, so as to protect the first photoelectric conversion part 110 from moisture penetrating from the outside.

In addition, an area occupied by the covering portion 132 is minimized, so that an area of photoelectric conversion can be ensured to a maximum extent.

Figure 7C:
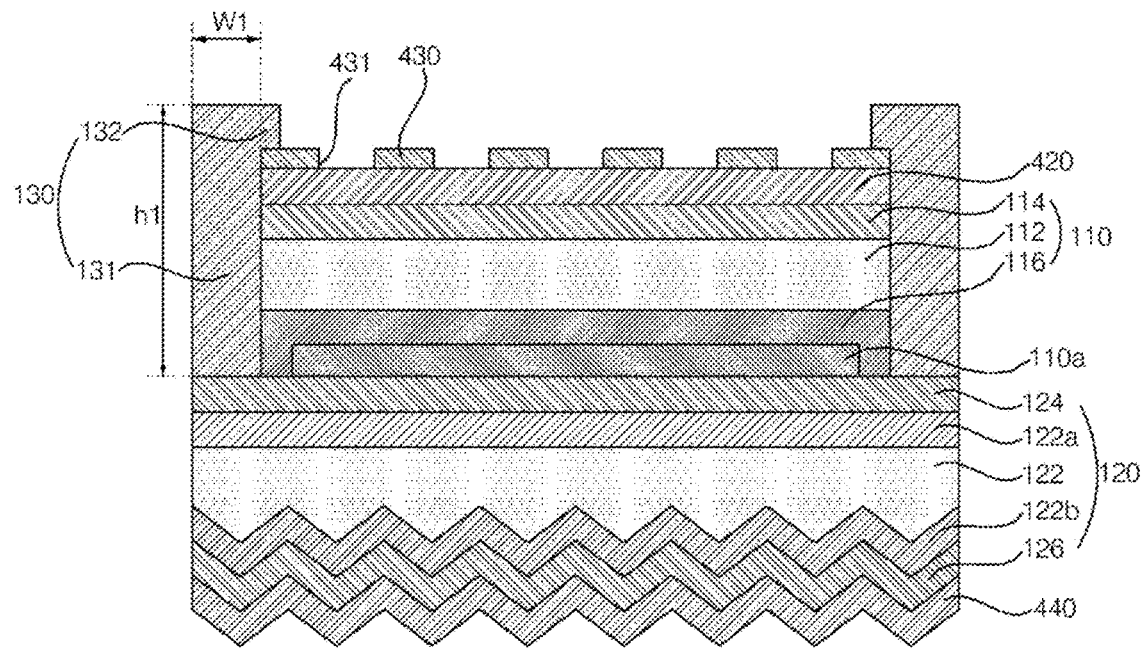

As described above, when the side insulating layer 130 is formed on the four side surfaces of the junction layer 110a of the solar cell 10 to constitute a frame, as shown in FIG. 7b, the mask 200 is removed, and as shown in FIG. 7c, the first photoelectric conversion part 110 therein is exposed.

In this case, due to the covering portion 132, an area of the exposed first photoelectric conversion part 110 may be reduced compared to that prior to the formation of the side insulating layer 130.

In this case, during the formation of the side insulating layer, a passivation film (not shown) may be simultaneously formed below the semiconductor substrate. When the passivation film as described above is formed on the back surface, a patterning process of forming a back opening portion for exposing the first electrode layer 440 below may also be included.

Figure 8A:
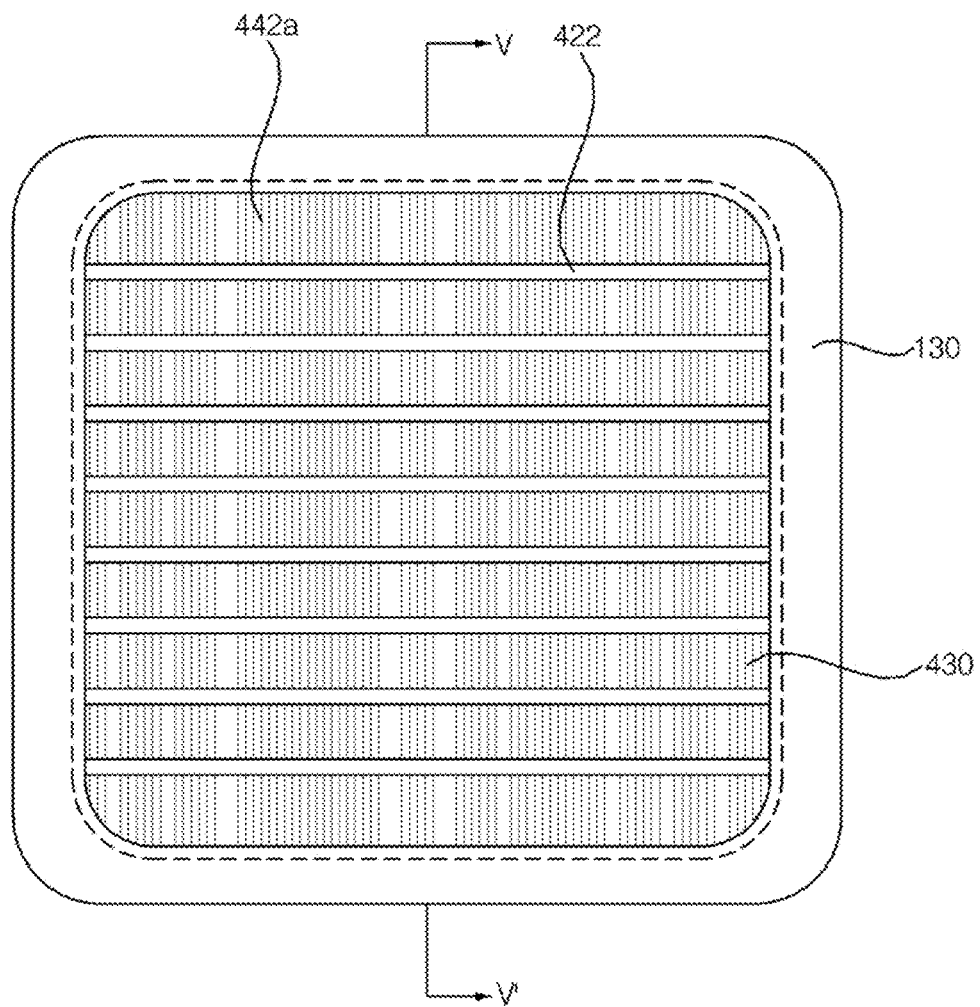
Figure 8B:
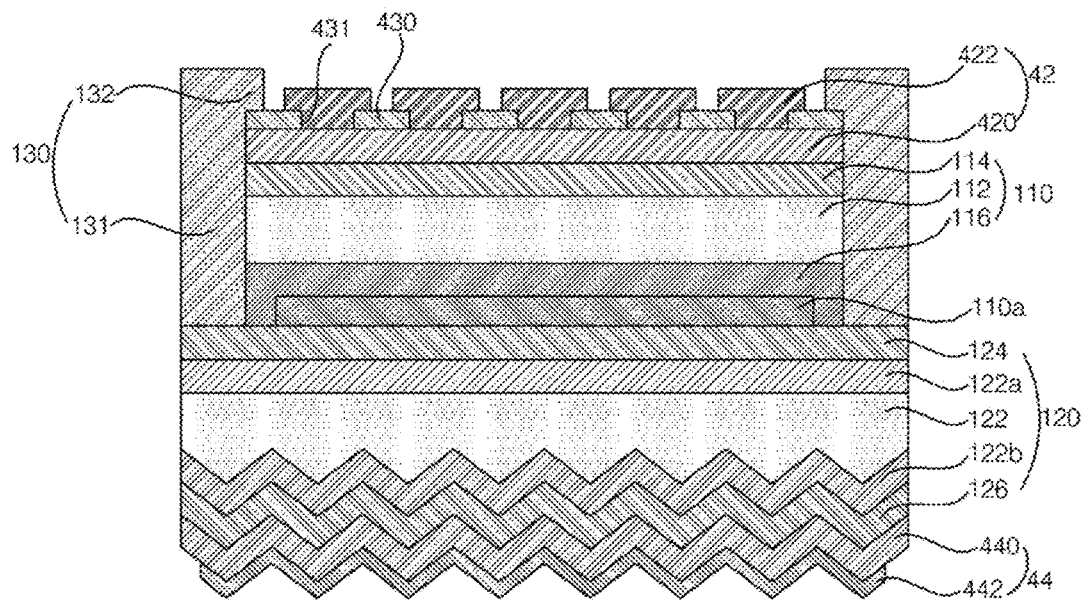

Next, as shown in FIG. 8a and FIG. 8b, in the step of forming the second electrode layer 422, a second electrode layer 422 of the first electrode 42 and a second electrode layer 442 of the second electrode 44 are formed (S40). In the following, although it is shown that the second electrode layer 422 of the first electrode 42 is formed as a single layer, a multi-layer structure may be formed in some other embodiments.

In this case, the second electrode layers 422a, 422b, 442a, and 442b of the first electrode 42 and the second electrode 44 are formed simultaneously.

Firstly, as shown in FIG. 8a, in order to form the second electrode layers 422 and 442 of the first electrode 42 and the second electrode 44, a deposition process is performed.

In this case, as the deposition process, sputtering, vacuum deposition, or coating (electroplating) is applicable in various manners.

As an example, when a sputtering layer formed by sputtering is formed, a temperature in a process of forming the second electrode layers 422 and 442 may be lower than 150° C. (100° C. to 145° C. as an example). The second electrode layers 422 and 442 may be formed by sputtering in a state where a mask or mask layer is provided, so that the second electrode layers 422 and 442 have desired patterns. In addition, the second electrode layers 422 and 442 may also include an additional conductive layer formed by sputtering or electroplating (electrolytic plating as an example) on the sputtering layer formed by sputtering. In addition, the second electrode layers 422 and 442 of the first electrode 42 and the second electrode 44 according to this embodiment may be formed by various processes performed below 150° C.

In this case, the second electrode layer 422 of the first electrode 42 includes a plurality of busbar electrodes 422 arranged in parallel in a direction as shown in FIG. 8b, and includes finger electrodes 422a intersecting the busbar electrodes 422.

The second electrode layer 442 of the second electrode 44 has a planar shape.

In this embodiment, after the second electrode layers 422 and 442 are formed, by a deposition process, in the solar cell 100 provided with the first photoelectric conversion part 110 composed of a perovskite compound, a covering layer may also be formed thereon to ensure a filling rate and excellent efficiency and reliability, so that the first electrode 42 and the second electrode 44 can be formed at a low temperature (i.e., below 150° C.).

As described above, when the first electrode 42 and the second electrode 44 are formed, a solar cell shown in FIG. 8*a* is formed. The solar cell 10 according to some embodiments of the present disclosure is formed to have a shape of the front surface and the back surface as shown in FIG. 1 and FIG. 2.

Then, cutting may be performed when the solar cell 10 is cut into a plurality of units for use, but is not limited thereto.

The solar cell 10 formed as described above may be modularized into various forms on a glass substrate (S50).

In addition, the second electrode layer 442 of the second electrode 44 of FIG. 2 may have a same shape as the second electrode layer 422 of the first electrode 42, and may be formed to include a plurality of finger electrodes (not shown) spaced apart from each other while having a predetermined pitch and busbar electrodes.

Since the electrodes 42 and 44 of the solar cell 10 have a predetermined pattern, the solar cell 10 may have a bi-facial structure that allows light to be incident on the front surface and the back surface of the semiconductor substrate 122. Therefore, an increase in light used in the solar cell 10 can help to improve efficiency of the solar cell 10. However, the present disclosure is not limited thereto.

Although it has been described above that the side insulating layer 130 is formed after the antireflection film 430 on the first photoelectric conversion part 110 is patterned, in some other embodiments, the antireflection film 430 may be patterned after the formation of the side insulating layer 130.

In the following, a solar cell module 100 provided by arranging the solar cells 10 in FIG. 3 in various manners is described.

Figure 9:
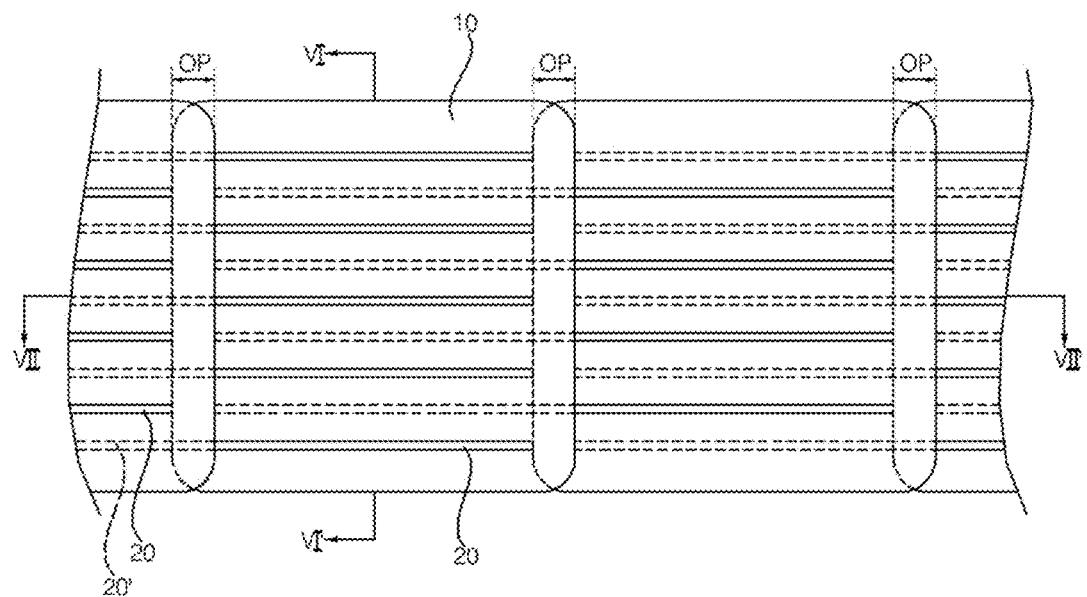
FIG. 9 is a plan view of a solar cell module according to some embodiments of the present disclosure.
Figure 10:
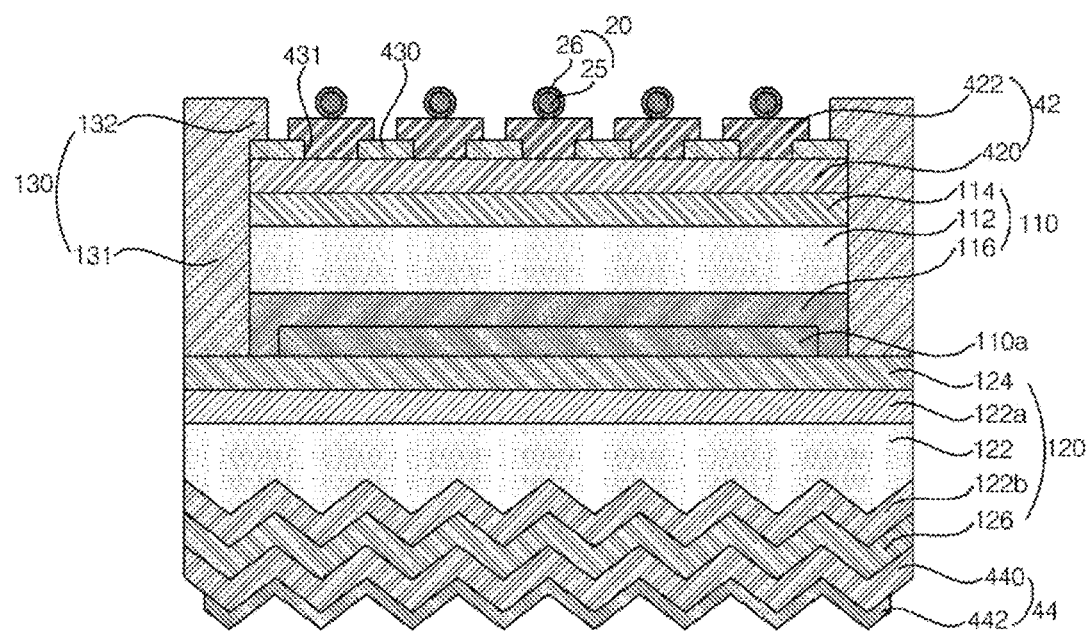
FIG. 10 is a cross-sectional view of a solar cell in a first direction in the solar cell module shown in FIG. 9.
Figure 11:
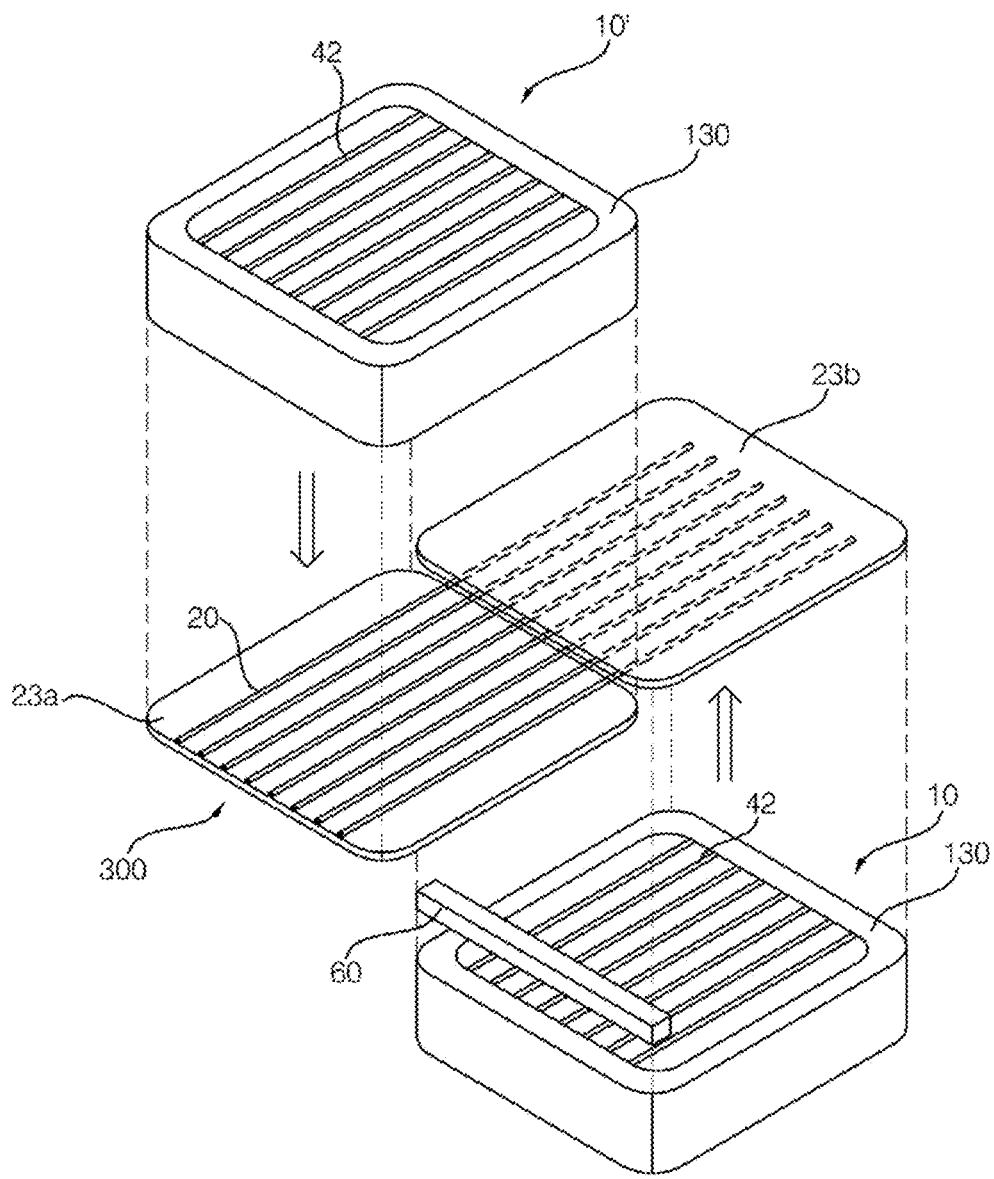
FIG. 11 is a diagram of a bonding process for a plurality of solar cells in a second direction in the solar cell module shown in FIG. 9.
Figure 12:
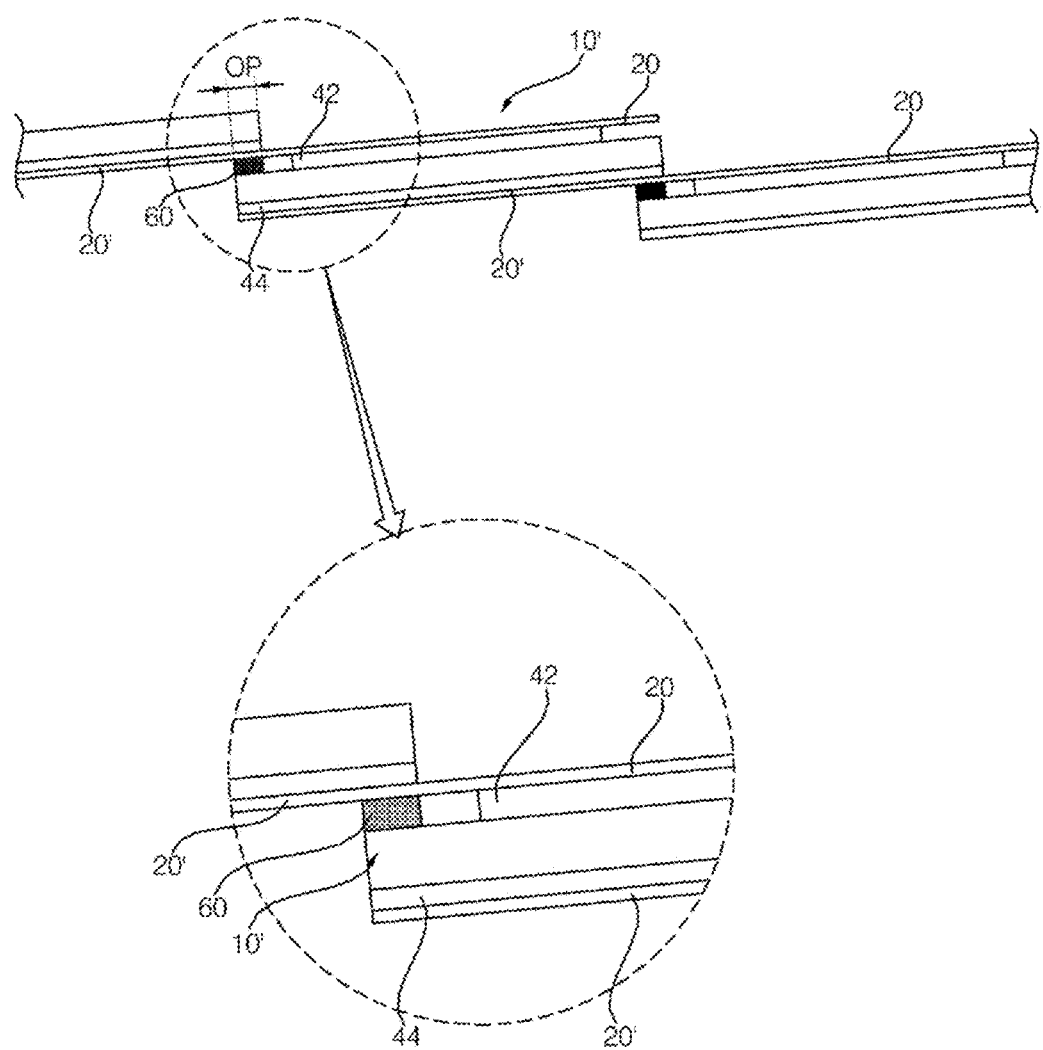
FIG. 12 is a cross-sectional view of a solar cell module obtained according to the bonding process in FIG. 11.

FIG. 9 is a plan view of a solar cell module according to some embodiments of the present disclosure, FIG. 10 is a cross-sectional view of a solar cell in a first direction in the solar cell module shown in FIG. 9, FIG. 11 is a diagram of a bonding process for a plurality of solar cells in a second direction in the solar cell module shown in FIG. 9, and FIG. 12 is a cross-sectional view of a solar cell module obtained according to the bonding process in FIG. 11.

Referring to FIG. 9 to FIG. 12, in the solar cell module 100 according to some embodiments of the present disclosure, the plurality of tandem solar cells 10 described above are stacked to overlap stepwise. For example, for a reference tandem solar cell 10, an upper adjacent tandem solar cell 10 and a lower adjacent tandem solar cell 10 partially overlap with the reference tandem solar cell 10, the upper tandem solar cell 10 is partially overlapped with an upper part of the reference tandem solar cell 10, and the lower tandem solar cell 10 is partially overlapped with a lower part of the reference tandem solar cell 10.

In this specification, the upper tandem solar cell 10 and the lower tandem solar cell may respectively refer to the tandem solar cell 10 arranged at a relatively lower part and the tandem solar cell 10 arranged at a relatively upper part based on any tandem solar cell 10 in the plurality of tandem solar cells 10 arranged to partially overlap stepwise as described above, and according to the tandem solar cell 10 as a reference, a same tandem solar cell 10 may be the upper tandem solar cell 10 or the lower tandem solar cell 10.

The tandem solar cell 10 according to this embodiment includes an overlapping portion OP, and when a tandem solar cell module 100 to be described later is formed in the overlapping portion OP so that adjacent tandem solar cells 10 overlap, as a region of the tandem solar cell 10 corresponding to an overlapping section, each of the tandem solar cells may include a first overlapping portion OP1 overlapping with the adjacent upper tandem solar cell 10 and a second overlapping portion OP1 overlapping with the adjacent lower tandem solar cell 10.

For example, as long as the plurality of tandem solar cells 10 are stacked to overlap stepwise in an arrangement direction, a specific tandem solar cell 10 overlaps with the upper adjacent tandem solar cell 10 and the lower adjacent tandem solar cells 10 and includes the first overlapping portion OP1 and the second overlapping portion OP2, and the first overlapping portion OP1 and the second overlapping portion OP2 are respectively arranged on two sides of the tandem solar cell 10 and are opposite to each other in the arrangement direction.

The overlapping portion OP2 according to this embodiment may be rectangular or geometrically variable according to the shape of the tandem solar cell 10. However, the shape of the overlapping portion OP is not limited to the description or the drawings, and should include a range that can be easily designed and changed to the shape of the overlapping portion by those of ordinary skill.

In this embodiment, a width of the overlapping portion is kept within the width W1 of the side insulating layer 130, so that stable modularization can be performed and a large light-receiving area can be ensured during the formation of the tandem solar cell module 100, thereby producing excellent solar cell output. When the width of the overlapping portion OP is less than 1 mm, bonding stability of adjacent tandem solar cells 10 may be reduced during the modularization. When the width of the overlapping portion OP is more than 3 mm, the light-receiving area of the tandem solar cell 10 is excessively reduced, and the output of the solar cell can be reduced instead.

Widths of the first overlapping portion OP1 and the second overlapping portion OP2 may be the same as or different from each other, and when the widths are different from each other, the widths of the first overlapping portion OP1 and the second overlapping portion OP2 may be different within a range of about 1 mm to about 3 mm.

That is, as shown in FIG. 11, in the tandem solar cell module 100 according to some other embodiments of the present disclosure, when a plurality of tandem solar cells 10 are stacked to overlap stepwise, a plurality of leads 20 crossing and connected to the second electrode layer 442 of the second electrode 44 of the upper adjacent tandem solar cell 10 and the second electrode layer 422 of the first electrode 42 of the lower tandem solar cell 10 are included.

In this case, the plurality of leads 20 may be formed in a same number as the busbar electrodes 422 when connecting two tandem solar cells 10, but may have a smaller number than that.

In order to form a plurality of leads 20 that overlap with a part of the two adjacent tandem solar cells 10 as described above while crossing the part, a process as shown in FIG. 11 may be performed.

Referring to FIG. 11, in the case of a module process according to some embodiments of the present disclosure, a lead film 300 for bonding a plurality of leads 20 is applicable.

In a state where the plurality of leads 20 are arranged to be spaced apart at a same pitch, the lead film 300 in FIG. 11 causes, in a half region in a length direction of the leads 20, a first support layer 23*a* supporting the plurality of leads 20 to be arranged below the leads 20, and causes, in the remaining half region in the length direction of the leads 20, a second support layer 23b supporting the plurality of leads 20 to be arranged above the leads 20.

The lead film 300 as described above has a structure that causes the support layers 23a and 23b for simultaneously supporting the plurality of leads 20 to be arranged below the leads 20 in a half region of the length and to be arranged above the leads 20 in the remaining half region.

In this case, for two overlapping solar cells 10, the lead film 300 is arranged below an upper solar cell 10' so that the leads 20 are exposed towards a second electrode 44 of the upper solar cell 10', and the remaining half region of the lead film 300 is arranged above a lower solar cell 10 so that the leads 20 are exposed towards a first electrode 42 of the lower solar cell 10.

Therefore, both the upper solar cell 10' and the lower solar cell 10 face each other in a state where they can be bonded to the leads 20 without being hindered by the support layers 23a and 23b.

Soldering is performed after alignment of the plurality of leads 20 exposed to the busbar electrodes 422 of the first electrode 42 of the lower solar cell 10, so that electrical and physical bonding of the busbar electrodes 422 to the leads 20 can be performed.

As described above, when the lower solar cell 10 is bonded to the lead film 300, the second electrode layer 442 of the second electrode 44 of the upper solar cell 10' is soldered to the leads 20 on an exposed opposite side of the lead film 300.

In this case, as shown in FIG. 2, the second electrodes 44 can be easily aligned without additional patterning.

When the leads 20 as described above are attached, as shown in FIG. 10, the leads may be arranged on the busbar electrodes 422 of the first electrode 42, and a cross section of the leads 20 may be circular or quadrilateral.

The corresponding lead 20 extend in the length direction while having a cross section of a predetermined shape. When observed, the cross section thereof may be implemented by a core layer 25 in a center and a solder layer 26 formed to surround the core layer 25.

The solder layer 26 surrounding the core layer 25 is partially melted in a soldering process and electrically and physically bonded to the busbar electrode 422 or the second electrode layer 442 of the second electrode 44 below.

When the upper solar cell 10 overlaps with the lower solar cell 10', only the lead remains by removing the corresponding support layers 23a and 23b of the lead film 300.

In this case, the connection portion 60 is arranged in an overlapping region of the two solar cells 10 and 10' for physical bonding of the two solar cells 10 and 10', so that the adjacent tandem solar cells 10 can be electrically and physically bonded more strongly.

The connection portion 60 may include a conductive adhesive portion, and based on two adjacent tandem solar cells 10, the conductive adhesive portion may be entirely arranged between the second overlapping portion OP2 of the upper tandem solar cell 10 and the first overlapping portion OP1 of the lower tandem solar cell 10. In this specification, "entirely arranged" includes a case where the conductive adhesive portion is physically perfectly arranged in the region or space and also a case where there is inevitably a part excluding a part. The conductive adhesive portion includes a polymer blend of epoxy acrylic fluorine, silicon, polyamide, and the like and has adhesive properties, and thus has conductive properties while physically stably binding adjacent tandem solar cells 10, thereby having a function of electrically connecting the adjacent tandem solar cells 10. The conductive adhesive part 60 may be made of various materials, which may be made of an electrical conductive adhesive (ECA) or the like as an example. However, the type of the conductive adhesive portion is not limited to the described content, and as long as the adjacent tandem solar cells 10 can be physically and electrically connected, a range that can be easily selected by those of ordinary skill may be included.

As described above, the second electrode layer 442 formed at the second overlapping portion OP2 of the upper tandem solar cell 10' is in contact with the first overlapping portion OP1 of the lower tandem solar cell 10 through a conductive adhesive layer, which constitutes a physical connection between two adjacent unit solar cells 10 and enables a plurality of leads 20 to contact simultaneously so as to be electrically connected.

Therefore, as described above, in the tandem solar cell module 100 according to some other embodiments of the present disclosure, when a plurality of tandem solar cells 10 are stacked to overlap stepwise, serial connection is performed through a plurality of leads 20 crossing the tandem solar cells, thereby improving productivity and reducing a defect rate.

A tandem solar cell module 100 according to some other embodiments of the present disclosure is described below with reference to FIG. 13 to FIG. 14.

Figure 13:
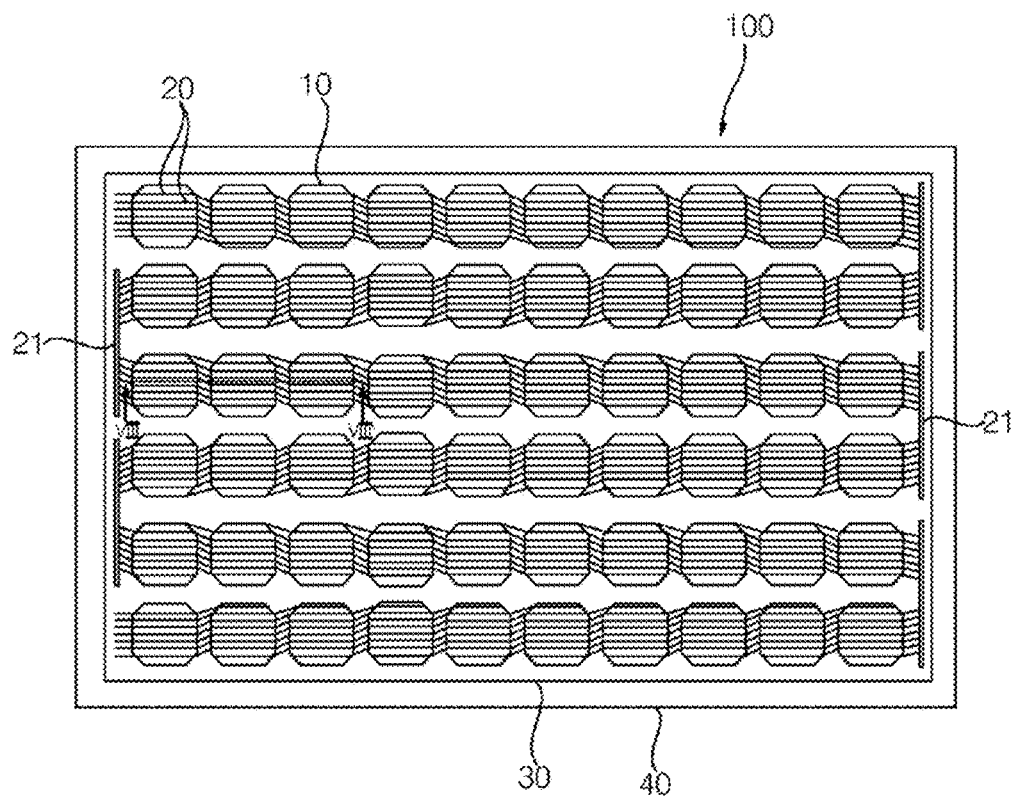
FIG. 13 is a plan view of a solar cell module according to some other embodiments of the present disclosure.
Figure 14:
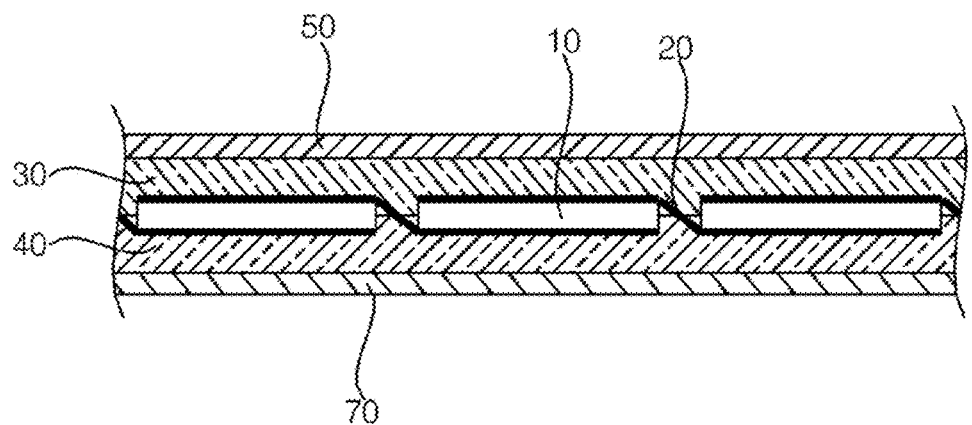
FIG. 14 is a cross-sectional view of cutting of the solar cell module in FIG. 13.

FIG. 13 is a plan view of a solar cell module according to some other embodiments of the present disclosure, and FIG. 14 is a cross-sectional view of cutting of the solar cell module in FIG. 13.

Referring to FIG. 13 to FIG. 14, in the solar cell module 100 according to some embodiments of the present disclosure, a plurality of tandem solar cells 10 are arranged in a matrix and are electrically connected to each other through a plurality of leads.

A plurality of tandem solar cells 10 are connected in a row direction through the plurality of leads 20 and constitute a string, and a plurality of strings are connected to each other and constitute the solar cell module 100.

In consideration of bonding between the electrodes and the leads 20, charge collection efficiency, and the like, power generation efficiency of the solar cell can be optimized by using 5 to 40 leads 20 for connecting adjacent tandem solar cells 10 to each other.

In the series connection as described above, the lead film 300 in FIG. 11 is also applicable.

That is, the plurality of leads 20 are bonded to the entire second electrode 44 formed on a back surface of a first solar cell in two adjacent tandem solar cells 10, and in addition, bonded to busbar electrodes 422 of the first electrode 42 formed on a front surface of a second solar cell adjacent to the first solar cell. Similarly, another lead 20 is bonded to the entire second electrode 44 of the second solar cell and bonded to busbar electrodes 422 of the first electrode 42 of a third solar cell adjacent to the second solar cell. In this case, the bonding between the lead 20 and the busbar electrode 422 can be formed only in an extended surface (pad region) of the busbar electrode 422, and in some other embodiments, the lead may be soldered with throughout the busbar electrode 422.

Since the first photoelectric conversion part 110 is not covered by the lead 20 as described above, the unit solar cells arranged in one string are connected in series without reducing the area of the active region of the solar cell.

In addition, the busbar 21 may connect the lead 20 connected to one end of a string of a first row and the lead 20 connected to one end of a string of a second row. Similarly, another busbar 21 connects the lead 20 connected to the other end of the string of the second row and the lead 20 connected to one end of a string of a third row. Thus, all the tandem unit solar cells 10 constituting the solar cell module 100 are connected in series with each other. The solar cell module 100 thus connected is sealed and protected by a front package 30 and a back package 40, and laminated in a state of being arranged between a front substrate 50 and a back substrate 70 to achieve integration.

The front substrate 50 is positioned on the front surface (a light-receiving surface where light enters) of the solar cell 10, and is made of a rigid material without flexibility for impact protection. As an example, the front substrate 50 may be formed of tempered glass or the like that has high transmittance and an excellent damage prevention function, or low-iron glass having a thickness below 3 mm (2 mm in some embodiments).

The back substrate 70 is positioned on the back surface of the solar cell (a non-light-receiving surface where no light enters), and is made of a flexible material different from the front substrate 50. The back substrate 70 prevents penetration of moisture from the back surface, thereby protecting the solar cell from an external environment. The back substrate 70 may have a multi-layer structure such as a layer for preventing penetration of moisture and oxygen and a layer for preventing chemical corrosion, and may be formed as a thin sheet made of an insulating material such as fluoropolymer (FP), polyester (PE), or fluoropolymer (FP).

The back substrate 70 may have unevenness on a surface, and may be printed with white or black enamel paste.

The front package 30 is manufactured to have a thickness that enables the lead 20 to be completely buried, so that the rigid front substrate 50 is not physically impacted by the lead 20.

The back package 40 is located between the back substrate 70 and the back surface of the solar cell 10 and is made of a transparent material that transmits light. The back package 40 also uses a resin product such as ethylene vinyl acetate (EVA) capable of absorbing shocks to prevent moisture penetration and protect the solar cell 10 from impact. In addition, the back package 40 is constituted to include a material that absorbs ultraviolet light to prevent deterioration, whereas the front package 30 does not include an ultraviolet light absorber to transmit all light, so that the development efficiency of the tandem solar cell 10 is good.

For the lamination, the solar cell module 100 as described above is first preheated to a temperature of 70 to 100 degrees Celsius, preferably about 85, and then the lamination is performed at a temperature of 120 to 160 degrees Celsius, preferably a temperature below 155 degrees Celsius.

As described above, the solar cell module 100 may be manufactured by arranging the solar cells 10 in FIG. 1 to FIG. 3.

In addition, a quantum dot solar cell 100 having a first photoelectric conversion part 110 of a perovskite structure shown in FIG. 1 to FIG. 3 formed at an upper part and a second photoelectric conversion part 140 at a lower part as described in the following.

A quantum dot solar cell according to another example of the present disclosure is described below with reference to FIG. 15.

Figure 15:
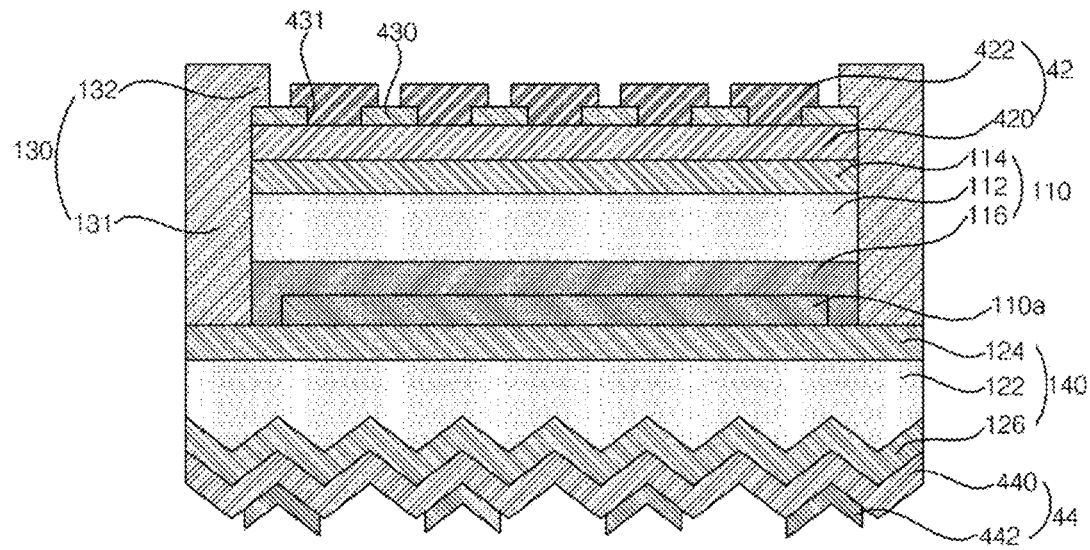
FIG. 15 is a cross-sectional view of a solar cell according to some other embodiments of the present disclosure.

Referring to FIG. 15, the quantum dot solar cell according to another example of the present disclosure may have a tandem structure further including a first photoelectric conversion part 110 including a photoelectric conversion layer 112 made of a perovskite compound and a second photoelectric conversion part 140 having a different material or structure from the first photoelectric conversion part 110.

In the solar cell 100 according to this applicable example, the second photoelectric conversion part 140 may have a pn junction structure including a semiconductor substrate 122. As an example, the second photoelectric conversion part 140 may include a semiconductor substrate 122, and conductive regions 124 and 126 formed in the semiconductor substrate 122 or on the semiconductor substrate 122. The conductive regions 124 and 126 may include a first conductive region 124 having a first conductivity type and a second conductive region 126 having a second conductivity type.

The semiconductor substrate 122 may be composed of a crystalline semiconductor (e.g., a monocrystalline or polycrystalline semiconductor, monocrystalline or polycrystalline silicon as an example) including a single semiconductor material (a Group IV element as an example). Then, based on the semiconductor substrate 122 with high crystallinity and few defects, the second photoelectric conversion part 120 may have excellent electrical properties. As an example, the second photoelectric conversion part 120 may have a crystalline silicon solar cell structure.

Since configuration of the semiconductor substrate 122 is the same as that of the semiconductor substrate 122 in FIG. 3, a detailed description thereof is omitted.

The first conductive region 124 having the first conductivity type may be formed on a front surface of the semiconductor substrate 122. In addition, the second conductive region 126 having the second conductivity type opposite to the first conductivity type of the semiconductor substrate 122 may be positioned (contact as an example).

The first conductive region 124 may be a region including a first-conductivity-type dopant and having the first conductivity type. In addition, the second conductive region 126 may be a region including a second-conductivity-type dopant and having the second conductivity type.

The first conductive region 124 and the second conductive region 126 may respectively include a same semiconductor material as the semiconductor substrate 122 (in some embodiments, a single semiconductor material, silicon as an example). As an example, the first conductive region 124 and the second conductive region 126 may be formed as an amorphous silicon (a-Si) layer, an amorphous silicon carbide (a-SiC$_x$) layer, an amorphous silicon oxide (a-SiO$_x$) layer, or the like. Then, differences in properties that may occur when the first conductive region 124 and the second conductive region 126 have similar properties to the semiconductor substrate 122 but include semiconductor materials different from each other can be minimized.

For example, each of the first conductive region 124 and the second conductive region 126 may be formed by doping the first-conductivity-type dopant or the second-conductivity-type dopant into an amorphous semiconductor or the like that can be easily manufactured with various methods such as deposition. Then, the first conductive region 124 and the second conductive region 126 may be easily formed through a simple process. In addition, each of the first conductive region 124 and the second conductive region 126 may be manufactured into a nanocrystalline silicon or polysilicon layer with various methods such as deposition, and may be formed by doping the first-conductivity-type dopant or the second-conductivity-type dopant. Then, the first conductive region 124 and the second conductive region 126 may be easily formed through a simple process.

In this embodiment, when the semiconductor substrate 122 (or the base region) has the first conductivity type, the second conductive region 126 may constitute an emission region forming a pn junction with the semiconductor substrate 122. The first conductive region 124 may constitute a front surface field region in which a front surface field is formed to prevent recombinations. Then, since the emission region that directly participates in photoelectric conversion is located on the back surface, the emission region may be formed with a sufficient thickness (formed to be thicker than the front electric field region as an example) to further improve photoelectric conversion efficiency. However, the present disclosure is not limited thereto. Since the semiconductor substrate 122 has the second conductivity type, the first conductive region 124 may also constitute an emission region, and the second conductive region 126 may also constitute a back surface field region.

In this embodiment, the first conductive region 124 and the semiconductor substrate 122 may have an n type, and the second conductive region 126 may have a p type. Then, in the first photoelectric conversion part 110 located on the second photoelectric conversion part 120, a first transport layer 114 located at an upper part may transport electrons, and a second transport layer 116 located at a lower part may transport holes. Compared with an opposite case, in this case, the first photoelectric conversion part 110 may bring an excellent effect. In addition, the semiconductor substrate 122 may have an n type, thereby prolonging a life time of the carriers. However, the present disclosure is not limited thereto, and the semiconductor substrate 122 has either the first conductivity type or the second conductivity type, or has either the n type or the p type, which may be modified in a variety of manners.

A junction layer (tunneling junction layer) 110a is located on a front surface of the second photoelectric conversion part 140 to connect the second photoelectric conversion part 120 with the first photoelectric conversion part 110 located thereabove. Although it is shown in the drawing that the junction layer 110a is in direct contact with the first conductive region 124 and the first photoelectric conversion part 110 respectively, the present disclosure is not limited thereto. The junction layer 110a may have a thin thickness, as an example, a thickness thinner than thicknesses of the electrode layers 420 and 440, so that tunneling of the carriers may occur smoothly.

The junction layer 110a may electrically connect the first photoelectric conversion part 110 with the second photoelectric conversion part 140, and may include a material that can transmit light (long-wavelength light as an example) used in the first photoelectric conversion part 110. As an example, the junction layer 110a may include at least one of a transparent conductive material (transparent conductive oxide as an example), a conductive carbon material, a conductive polymer, and n-type or p-type amorphous silicon. In some other embodiments, the junction layer 110a may be formed as a structure in which silicon layers having different refractive indexes from each other are alternately stacked, whereby light used in the second photoelectric conversion part 120 (short-wavelength light as an example) can be reflected by the second photoelectric conversion part 120 and light used in the first photoelectric conversion part 110 (long-wavelength light as an example) may be transmitted and supplied to the first photoelectric conversion part 110.

Since a detailed configuration of the junction layer 110a is the same as that in FIG. 3, a description thereof will be omitted.

A step is formed around the first photoelectric conversion part 110 due to an area difference between the second photoelectric conversion part 120 and the first photoelectric conversion part 110, so as to form, at an edge, a step region NA exposing the second photoelectric conversion part 120 below.

The step region NA as described above may be formed on edges of four side surfaces centered on the non-active region NA in a central region, so as to have a frame shape.

When the first photoelectric conversion part 110 is formed on the second photoelectric conversion part 120 by a deposition process, the four side surfaces of the solar cell 10 as described above are formed to include a region where two legs of a fixing portion of a deposition machine that fixes the semiconductor substrate 122 of the solar cell 10 in the deposition machine are located on the semiconductor substrate 122.

Therefore, the fixing portion of the deposition machine may be located in at least one of step regions NA formed on the four side surfaces of the solar cell 10 in a length direction.

Therefore, the junction layer 110a and the first photoelectric conversion part 110 including the photoelectric conversion layer 112 including a perovskite compound may be positioned while the step region NA as described above is formed on the second photoelectric conversion part 140. The first photoelectric conversion part 110 is also only limitedly formed on the junction layer 110a to maintain the step region NA, so as to keep the area difference between the second photoelectric conversion part 140 and the first photoelectric conversion part 110 constant.

In addition, the first photoelectric conversion part 110 may include a photoelectric conversion layer 112, a second transport layer (second carrier transport layer) 116 on one side of the photoelectric conversion layer 112 and between the junction layer 110a and the photoelectric conversion layer 112, and a first transport layer (first carrier transport layer) 114 on the other side of the photoelectric conversion layer 112 and between the photoelectric conversion layer 112 and the first electrode 42.

Since structures and materials of respective layers of the first photoelectric conversion part 110 are the same as those in FIG. 3, detailed descriptions thereof will be omitted.

In addition, the first electrode 42 may be located on the first photoelectric conversion part 110 (the first transport layer 114 on the front surface thereof as an example), and the second electrode 44 may be located on the second photoelectric conversion part 140 (the second conductive region 126 on the back surface thereof as an example). That is, the solar cell 10 according to this embodiment may have a tandem structure in which the second photoelectric conversion part 140 based on a single semiconductor material (silicon as an example) is bonded to the first photoelectric conversion part 110 based on a perovskite compound through the junction layer 110a.

In addition, the side insulating layer 130 of the solar cell 10 in FIG. 3 according to some embodiments of the present disclosure and the solar cell 10 in FIG. 15 according to some other embodiments may have the following structures.

Figure 16:
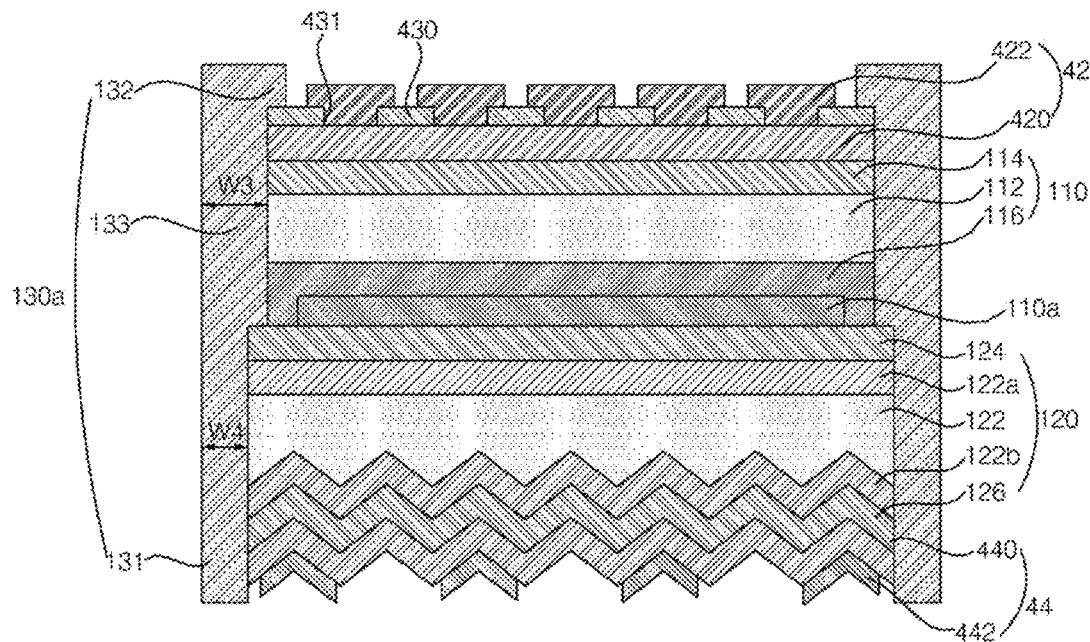
FIG. 16 is a cross-sectional view of a solar cell according to some other embodiments of the present disclosure.

FIG. 16 is a cross-sectional view of a solar cell according to some other embodiments of the present disclosure.

Referring to FIG. 16, in the solar cell according to some other embodiments of the present disclosure, the first photoelectric conversion part 110 and the second photoelectric conversion part 120 have a step region NA and are electrically and physically bonded through the junction layer 110a, and a side insulating layers 130a that fills the step region NA and surrounds all of the four side surfaces of the solar cell 10 is included.

For some another embodiments of FIG. 16, since configuration of the first photoelectric conversion part 110, the junction layer 110a, the second photoelectric conversion part 120, the first electrode 42, and the second electrode 44 is the same as that in FIG. 3, detailed descriptions thereof are omitted.

The side insulating layer 130a of the solar cell according to some another embodiments of FIG. 16 is formed from a tail end of the second photoelectric conversion part 120 to an upper part of the first photoelectric conversion part 110, that is, formed to a height up to a total thickness of the solar cell.

In this case, the side insulating layer 130a may include a side portion 133 arranged on a side surface, and a covering portion 132 covering part of the upper surface.

The side portion 133 has a height up to the total thickness of the solar cell 10, a region covering the side surface of the second photoelectric conversion part 120 has a third thickness w4, a region covering the side surface of the first photoelectric conversion part 110 may be formed to have a second thickness w3, and the second thickness w3 may be greater than the third thickness w4, which is not limited thereto and may be formed in a case where the side surfaces have a step.

The side insulating layer 130a is identically formed on the four side surfaces while filling the step region NA, so as to be formed to have a shape of a frame type integrally surrounding the four side surfaces of one solar cell 10.

The side insulating layer 130a may be formed by atomic deposition, chemical deposition, or physical deposition, but is not limited thereto.

The side insulating layer 130a may be formed of a compound including oxide, and the like, and as an example, SiC, SiN, or the like is applicable.

In this case, the covering portion 132 may be formed to have a width narrower than that of the side surface portion 133, and cover an edge on the antireflection film 430 of the first photoelectric conversion part 110, thereby preventing penetration of moisture into the first photoelectric conversion part 110 from the outside.

In addition, the side insulating layer 130a may further include a lower covering portion (not shown) covering part of the second electrode 44 of the second photoelectric conversion part 120, but is not limited thereto.

The features, structures, effects, and the like above are included in at least one embodiment of the present disclosure, and are not necessarily limited to only one embodiment. In addition, the features, structures, effects, and the like exemplified in various embodiments can also be implemented by combining or modifying other embodiments by those skilled in the art to which the embodiments belong. Therefore, content related to such combinations and modifications should be construed as being included in the scope of the present disclosure.

What is claimed is:

1. A solar cell, comprising:
    a first photoelectric conversion part, wherein the first photoelectric conversion part comprises a photoelectric conversion layer composed of a perovskite compound, a first transport layer on one side of the photoelectric conversion layer, and a second transport layer on the other side of the photoelectric conversion layer;
    a second photoelectric conversion part, wherein the second photoelectric conversion part is arranged below the second transport layer of the first photoelectric conversion part and has a material or structure different from that of the first photoelectric conversion part;
    a side insulating layer formed as a side surface surrounding the first photoelectric conversion part, wherein the side insulating layer is configured to protect the first photoelectric conversion part from moisture penetrating from the outside;
    a first electrode electrically connected to the first photoelectric conversion part on one surface of the first photoelectric conversion part, wherein the one surface of the first photoelectric conversion part is a light-receiving surface; and
    a second electrode electrically connected to a bottom of the second photoelectric conversion part;
    wherein the first photoelectric conversion part has a smaller area than the second photoelectric conversion part to have a step region on the second photoelectric conversion part, and the step region is formed on the entire side surface of the first photoelectric conversion part; and
    wherein the side insulating layer comprises:
    a side surface portion, wherein the side surface portion surrounds the entire side surface of the first photoelectric conversion part; and
    a covering portion, wherein the covering portion bends from the side surface portion and covers part of an upper surface of the first photoelectric conversion part, wherein the side insulating layer comprises an oxide film or a nitride film,
    wherein the side surface portion of the side insulating layer is arranged in the step region, and
    wherein the side insulating layer is formed in a frame shape surrounding the first photoelectric conversion part.

2. The solar cell according to claim 1, wherein the first electrode comprises a plurality of busbar electrodes extending in a direction and a plurality of finger electrodes intersecting with and connected to the plurality of busbar electrodes.

3. The solar cell according to claim 1, wherein the side surface portion of the side insulating layer extends from the first photoelectric conversion part and is formed to a tail end of the second photoelectric conversion part to surround an entire side surface of the solar cell.

4. A solar cell module, comprising:
    a plurality of solar cells; and
    a plurality of connecting members connected between adjacent ones of the plurality of solar cells,
    wherein each of the solar cells comprises:
    a first photoelectric conversion part, wherein the first photoelectric conversion part comprises a photoelectric conversion layer composed of a perovskite compound, a first transport layer on one side of the photoelectric conversion layer, and a second transport layer on the other side of the photoelectric conversion layer;
    a second photoelectric conversion part, wherein the second photoelectric conversion part is arranged below the second transport layer of the first photoelectric conversion part and has a material or structure different from that of the first photoelectric conversion part;
    a side insulating layer as a side surface surrounding the first photoelectric conversion part;
    a first electrode electrically connected to the first photoelectric conversion part on one surface of the first photoelectric conversion part, wherein the one surface is a light-receiving surface; and
    a second electrode electrically connected to a bottom of the second photoelectric conversion part, wherein the side insulating layer comprises an oxide film or a nitride film, wherein the side surface portion of the side insulating layer is arranged in the step region, wherein the side insulating layer is formed in a frame shape surrounding the first photoelectric conversion part, and wherein the first electrode comprises a plurality of busbar electrodes spaced apart from each other and extending in a direction.

5. The solar cell module according to claim 4, wherein adjacent solar cells of the plurality of solar cells comprise ends that overlap with each other and are physically bonded, and across an overlapping region, each of the connecting members electrically connects the second electrode of one solar cell of the adjacent solar cells and the busbar electrodes of the other solar cell of the adjacent solar cells.

6. The solar cell module according to claim 5, wherein the connecting members comprise a plurality of leads extending in parallel from the second electrode of an upper adjacent solar cell to the busbar electrodes of the first electrodes of lower adjacent solar cell.

7. The solar cell module according to claim 6, wherein the plurality of solar cells include a first solar cell, a second solar cell, and a third solar cell, the first solar cell is an upper adjacent solar cell of the second solar cell, and the third solar cell is a lower adjacent solar cell of the second solar cell;

the second solar cell comprises: a first overlapping portion overlapping with the upper adjacent solar cell; a second overlapping portion overlapping with the lower adjacent solar cell; and conductive adhesive portions arranged in the first overlapping portion and the second overlapping portion respectively.

8. The solar cell module according to claim 7, wherein each of the plurality of leads comprises a core portion extending in a length direction and a soldering layer surrounding the core portion and electrically bonded to the first electrode and the second electrode through soldering.

9. The solar cell module according to claim 4, wherein the plurality of solar cells are arranged spaced apart from each other, and each of the connecting members comprises a plurality of leads connecting the first electrode of a solar cell of the plurality of solar cells and the second electrode of an adjacent solar cell of the plurality of solar cells.

10. A method for manufacturing a solar cell, comprising:
forming a second photoelectric conversion part comprising a conductive region on a semiconductor substrate;
forming, on the second photoelectric conversion part, a first photoelectric conversion part comprising a photoelectric conversion layer composed of a perovskite compound, a first transport layer on one side of the photoelectric conversion layer, and a second transport layer on the other side of the photoelectric conversion layer;
forming a side insulating layer surrounding a side surface of the first photoelectric conversion part;
and forming a first electrode on one surface of the first photoelectric conversion part and a second electrode, wherein the one surface is a light-receiving surface, the first electrode is electrically connected to the first photoelectric conversion part and has cutting region to expose a center, and the second electrode is electrically connected to a bottom of the second photoelectric conversion part and has the cutting region;

wherein the side insulating layer comprises an oxide film or a nitride film, wherein the side insulating layer is arranged on the side surface of the first photoelectric conversion part, and wherein the side insulating layer is formed in a frame shape surrounding the first photoelectric conversion part.

11. The method according to claim 10, wherein, in the formation of the first photoelectric conversion part, the first photoelectric conversion part having a smaller area than the second photoelectric conversion part is formed on the second photoelectric conversion part.

12. The method according to claim 11, wherein the forming the side insulating layer comprises:
arranging, on the second photoelectric conversion part, a mask exposing the side surface; and depositing the side insulating layer with a predetermined height on the exposed side surface.

13. The method according to claim 12, wherein, in the deposition of the side insulating layer, a covering portion covering part of an edge of the first photoelectric conversion part is further formed.

14. The method according to claim 12, wherein the forming the first photoelectric conversion part comprises:
forming, on the second photoelectric conversion part, a junction layer having a first area; and
forming, on the junction layer, the first photoelectric conversion part having a second area larger than the first area,
wherein the second area is smaller than an area of the second photoelectric conversion part.

15. The method according to claim 14, wherein the side insulating layer is formed to surround the entire side surface of the first photoelectric conversion part and the second photoelectric conversion part.

* * * * *